(12) United States Patent
Maki

(10) Patent No.: US 7,339,429 B2
(45) Date of Patent: Mar. 4, 2008

(54) ADJUSTING METHODS OF ARITHMETIC MULTIPLYING CIRCUIT, DRIVE CIRCUIT, AND PHASE MARGIN

(75) Inventor: Katsuhiko Maki, Suwa (JP)

(73) Assignee: Seiko Epson Corporation (JP)

( * ) Notice: Subject to any disclaimer, the term of this patent is extended or adjusted under 35 U.S.C. 154(b) by 131 days.

(21) Appl. No.: 11/008,801

(22) Filed: Dec. 9, 2004

(65) Prior Publication Data
US 2005/0127997 A1   Jun. 16, 2005

(30) Foreign Application Priority Data
Dec. 10, 2003   (JP) ............... 2003-412270

(51) Int. Cl.
*H03F 3/45* (2006.01)
(52) U.S. Cl. .............. 330/253; 330/255; 330/260
(58) Field of Classification Search ........ 330/253, 330/255, 260
See application file for complete search history.

(56) References Cited

U.S. PATENT DOCUMENTS

| | | | |
|---|---|---|---|
| 5,049,834 A * | 9/1991 | Kasai ............... | 330/255 |
| 5,410,273 A * | 4/1995 | Brehmer et al. ....... | 330/253 |
| 5,442,370 A * | 8/1995 | Yamazaki et al. ...... | 345/94 |
| 6,222,416 B1 * | 4/2001 | Edeler .............. | 330/255 |
| 6,633,191 B2 * | 10/2003 | Hu ................. | 327/323 |
| 6,753,731 B2 | 6/2004 | Maki | |
| 7,019,730 B2 * | 3/2006 | Tsuchiya ............ | 345/98 |

FOREIGN PATENT DOCUMENTS

| | | |
|---|---|---|
| JP | 06-149188 | 5/1994 |
| JP | 11-150427 | 6/1999 |
| JP | 2003-229725 | 8/2003 |

OTHER PUBLICATIONS

Communication from Japanese Patent Office regarding related application.

* cited by examiner

*Primary Examiner*—Patricia Nguyen
(74) *Attorney, Agent, or Firm*—Harness, Dickey & Pierce, P.L.C.

(57) ABSTRACT

An arithmetic amplifying circuit for driving a capacitive load is provided including a voltage follower circuit converting an input signal to impedance, and a resistance circuit which is serially connected between the voltage follower circuit and an output of the arithmetic amplifying circuit. The voltage follower circuit includes a differential section, which amplifies a differential between the input signal and the output signal of the voltage follower circuit, and an output section, which outputs the output signal of the voltage follower circuit based on an output of the differential section, and drives a capacitive load via the resistance circuit.

16 Claims, 18 Drawing Sheets

| DIFFERENTIAL SECTION | OUTPUT SECTION | WHEN LOAD NOT CONNECTED | WHEN LOAD CONNECTED |
|---|---|---|---|
| THROUGHPUT RATE SMALL (SLOW) | THROUGHPUT RATE LARGE (FAST) | PHASE MARGIN LARGE | PHASE MARGIN SMALL |
| THROUGHPUT RATE LARGE (FAST) | THROUGHPUT RATE SMALL (SLOW) | PHASE MARGIN SMALL | PHASE MARGIN LARGE |
| EQUAL | | PHASE MARGIN SMALL | PHASE MARGIN LARGE |

FIG. 5

ADJUSTING METHODS OF ARITHMETIC MULTIPLYING CIRCUIT, DRIVE CIRCUIT, AND PHASE MARGIN

RELATED APPLICATIONS

This application claims priority to Japanese Patent Application No. 2003-412270 filed Dec. 10, 2003 which is hereby expressly incorporated by reference herein in its entirety.

BACKGROUND

1. Field of the Invention

The present invention relates to adjusting methods of an arithmetic multiplying circuit, a drive circuit, and a phase margin.

2. Related Art

As a liquid crystal panel (electrooptical device) used in electronic equipment such as a mobile phone, there are conventionally known a liquid crystal panel of a simple matrix system and a liquid crystal panel of an active matrix system using a switching element such as a thin film transistor (hereinafter abbreviated as TFT).

While the simple matrix system is advantageous in that its low power consumption can be easily implemented, its disadvantage lies in its difficulty to provide multiple colors and animation display. On the other hand, the active matrix system is advantageous in that it is suited for multiple colors and animation displays, whereas its disadvantage lies in its difficulty to provide low power consumption.

In recent years, demand for multi-color, animation displays is high to provide high quality images in electronic equipment of a portable type such as a mobile phone. Consequently, in lieu of the liquid crystal panel of the simple matrix system thus far used, the liquid crystal panel of the active matrix system is being used now.

In the liquid crystal panel of the active matrix system, it is preferable to set up an arithmetic amplifying circuit (operating amplifier) that functions as an output buffer in a data line drive circuit driving a data line of the liquid crystal panel.

Prior-art arithmetic amplifying circuits of this type included a differential amplifying circuit and an output circuit and fed back an output of the output circuit to the differential amplifying circuit. Because of a large drive capacity of the output circuit, a reaction rate of the output circuit was extremely fast as compared to the reaction rate of the differential amplifying circuit, a capacitor for preventing oscillation was inserted to prevent oscillation in a pass that fed back the output of the output circuit (refer to Japanese Unexamined Patent Publication No. Hei6-149188 and Japanese Unexamined Patent Publication No. 2003-229725).

However, in the conventional configuration, inasmuch as the capacitor for preventing oscillation was indispensable in the arithmetic amplifying circuit, it was difficult to reduce circuit size. Particularly in a case where application is made to the data line drive circuit as the output buffer, the arithmetic amplifying circuit is set up, for example, for every 720 data lines, thereby enlarging a chip area and causing high cost.

Also, the reaction rate of the output circuit, which is extremely fast as compared to the reaction rate of the differential amplifying circuit, becomes slow with an increase in load capacity. As a result, the reaction rate of the arithmetic amplifying circuit and the reaction rate of the output circuit come closer to each other, making it easy for oscillation to occur. This shows that, as a size of a display panel expands, an output load of the arithmetic amplifying circuit that functions as the output buffer also increases, so that margin for oscillation diminishes.

Further, it is necessary to change a volume value of the capacitor for oscillation prevention, together with the output load, when a capacitor is formed inside the circuit, the switching element and the like will be newly needed to perform trimming of the capacitor. In addition, the capacitor characteristics themselves deteriorate.

The present invention has been made in view of the above-mentioned technical problems. It is an object thereof to provide methods of adjusting the arithmetic amplifying circuit, the drive circuit, and the phase margin which prevent oscillation at low cost while increasing drive capacitive load.

SUMMARY

To accomplish the above-mentioned object, the present invention includes a voltage follower circuit which subjects an input signal to impedance conversion, and a resistance circuit which is serially connected between the voltage follower circuit and the arithmetic amplifying circuit, the voltage follower circuit comprising a differential section, in which the voltage follower circuit amplifies a differential between the input signal and the output signal of the voltage follower circuit, and an output section, which outputs an output signal of the voltage follower circuit based on the output of the differential section, wherein the arithmetic amplifying circuit for driving the capacitive load is related through the resistance circuit.

According to the present invention, for conversion of an infinite input of impedance to small impedance, a resistance circuit is set up in an output of the voltage follower circuit typically used for the load to be driven via the resistance circuit. By this means, it becomes possible to adjust a throughput rate (response rate) with the resistance value of the resistance circuit and the load capacity of the capacitive load. Accordingly, to prevent oscillation determined by a relationship between the throughput rate of the output of the differential section and the throughput rate of the output of the output section which makes the differential section feed back that output, a capacitor for phase compensation set up in the arithmetic amplifying circuit may be made unnecessary.

Further, in an arithmetic amplifying circuit according to the present invention, the throughput rate of the differential section may be equal to the throughput rate of the output of the output section or larger than the throughput rate of the output of the output section.

In the present invention, the phase margin of the arithmetic amplifying circuit is small when the load is not connected, and when the load is connected, the throughput rate of the output of the output section becomes small and the phase margin of the arithmetic amplifying circuit becomes large. Consequently, by considering the phase margin when the load is not connected, it is possible to certainly prevent oscillation when the load is connected.

Further, an arithmetic amplifying circuit according to the present invention, the resistance circuit may include a variable resistance element.

Still further, an arithmetic amplifying circuit according to the present invention, the resistance circuit may include a plurality of analog switching elements n which each analog switching element is connected in parallel.

Furthermore, an arithmetic amplifying circuit according to the present invention includes a resistance value setting register, whereby the resistance value of the resistance circuit may be altered according to the content set by the resistance value setting register.

According to the present invention, an arithmetic amplifying circuit which can provide the phase margin corresponding to the load capacity of the capacitive load may be included.

Further, in an arithmetic amplifying circuit according to the present invention, the differential section includes: a source of each transistor connected to a first current source (CS1), a first pair of differential transistors (PT1 and PT2) of a first conductive type, a gate of each transistor of which an input signal (Vin) and an output signal (Vout) are inputted into, concurrently a first conductive type differential amplifying circuit (100) having a first current mirror circuit (CM1) generating a drain current of each transistor of the first pair of differential transistors, concurrently when a source of each transistor is connected to a second current source (CS2), a second pair of differential transistors (NT3 and NT4) of a second conductive type, a gate of each transistor of which the input signal and the output signal are inputted into, a second conductive type differential amplifying circuit (110) having a second current mirror circuit (CM2) generating a drain current of each transistor of the second pair of differential transistors, a first auxiliary circuit (130) driving at least one of a first output node (ND1) and a first inverted output node (NXD1) which are drains of two transistors constituting the first pair of differential transistors based on the input signal (Vin) and the output signal (Vout), and a second auxiliary circuit (140) driving at least one of a second output node (ND2) and a second inverted output node (NXD2) which are drains of two transistors constituting the second pair of differential transistors based on the input signal (Vin) and the output signal (Vout); and the output section includes a first drive transistor (NT01) of the second conductive type in which a gate voltage is controlled based on a voltage of the first output node (ND1), and a second drive transistor (PT01) of the first conductive type in which its drain is connected to the drain of the first drive transistor and its gate voltage is controlled based on a voltage of the second output node (ND2), whereby the drain voltage of the first drive transistor (NT01) is outputted as the output signal (Vout), and when, of the transistors constituting the first pair of differential transistors (PT1 and PT2), an absolute value of a voltage between the gate and source of a transistor (PT1) whose gate is inputted with the input signal (Vin) is less than an absolute value of a threshold voltage of the transistor, as the first auxiliary circuit (130) drives at least one of the first output node (ND1) and the first inverted output node (NXD1), the gate voltage of the first drive transistor (NT01) is controlled, while, when, of the transistors constituting the second pair of differential transistors (NT3 and NT4), the absolute value of a voltage between the gate and source of the transistor (NT3) whose gate is inputted with the input signal (Vin) is less than an absolute value of a threshold voltage of the transistor, as the second auxiliary circuit (140) drives at least one of the second output node (ND2) and the second inverted output node (NXD2), a gate voltage of the second drive transistor (PT01) may be controlled.

In the present invention, the arithmetic amplifying circuit includes the first conductive type differential amplifying circuit and the second conductive type differential amplifying circuit, the input signal and the output signal being inputted into a respectively different conductive type pair of differential transistors. Transistors constituting each pair of differential transistors are connected to the current source, while concurrently a drain current of each transistor is generated by the current mirror circuit. The output circuit outputs the output signal based on the voltage of an output node of each differential amplifying circuit.

If there is inputted an input signal in a range in which the first and the second pairs of differential transistors operate, the first and the second conductive type differential amplifying circuits perform differential amplification of respective input signals and output signals and control gate voltages of the first and the second transistors.

If there is inputted an input signal in a range in which the first pair of differential transistors operates and the second pair of differential transistors does not operate, the first conductive type differential amplifying circuit performs differential amplification of an input signal and an output signal and controls the gate voltage of the first drive transistor constituting the output circuit. On the other hand, since each node of the second conductive type differential amplifying circuit becomes indefinite, the second auxiliary circuit drives at least one of the second output node and the second inverted output node of the second conductive type differential amplifying circuit, thereby controlling the gate voltage of the second drive transistor.

If there is inputted an input signal in a range in which the second pair of differential transistors operates and the first pair of differential transistors does not operate, the second conductive type differential amplifying circuit performs differential amplification of an input signal and an output signal and controls the gate voltage of the second drive transistor constituting the output circuit. On the other hand, since each node of the first conductive type differential amplifying circuit becomes indefinite, the first auxiliary circuit drives at least one of the first output node and the first inverted output node of the first conductive type differential amplifying circuit, thereby controlling the gate voltage of the first drive transistor.

By doing so, the gate voltages of the first and the second drive transistors constituting the output circuit can be controlled, thereby being able to provide a voltage follower circuit having a differential section whose reaction rate is faster than the output section.

Further, it is possible to eliminate generation of through current arising from the input signal being in a range of the input insensitive zone. In addition, by eliminating the input insensitive zone (dead zone) of the input signal, it is not necessary to set up an offset in consideration of a scattering of the threshold voltage of the first and the second conductive type transistors. As a result, an arithmetic amplifying circuit may be formed with a voltage between the power voltage on a high potential side and the power voltage on a low potential side as an amplitude, thus enabling an operating voltage to be made narrow without lowering the drive capacity and further power consumption to be reduced. This means packing of a booster circuit and low-voltage of a manufacturing process, realizing low cost.

It should be noted that other elements (such as a switching element) may be set up between the first pair of differential transistors and a first current source, between the second pairs of differential transistors and a second current source, or between drains of the first and the second drive transistors.

Further, in an arithmetic amplifying circuit according to the present invention, the differential section includes: a first conductive type differential amplifying circuit (100) amplifying a differential between an input signal (Vin) and an output signal (Vout), a second conductive type differential amplifying circuit (110) amplifying a differential between the input signal (Vin) and the output signal (Vout), a first auxiliary circuit (130) driving at least one of a first output node (ND1) and a first inverted output node (NXD1) based on the input signal (Vin) and the output signal (Vout), and a second auxiliary circuit (140) driving at least one of a second output node (ND2) and a second inverted output node (NXD2) of the second conductive type differential amplifying circuit, and the output section generating the output signal (Vout) based on the voltage of the first and the second output nodes (ND1 and ND2); the first conductive type differential amplifying circuit (100) including a first current source (CS1) with a first power voltage (VDD) being supplied to one end, and a first pair of differential transistors (PT1 and PT2) of a first conductive type (PT1 and PT2), in which a source of each transistor is connected to the other end of the first current source (CS1), a drain of each transistor being connected to respective first output node (ND1) and the first inverted output node (NXD1), the input signal (Vin) and the output signal (Vout) being inputted to the gate of each transistor, and a first current mirror circuit (CM1) having a first pair of transistors (NT1 and NT2) of a second conductive type in which gates are mutually connected, wherein: a second power voltage (VSS) is supplied to a source of each transistor constituting the first pair of transistors (NT1 and NT2); a drain of each transistor is connected to respective first output node (ND1) and the first inverted output node (NDX1); of the transistors constituting the first pair of transistors (NT1 and NT2), a drain and a gate of the transistor (NT2) connected to the first inverted output node (NXD1) are connected; the second conductive type differential amplifying circuit (110) including a second current source (CS2) with a second power voltage (VSS) being supplied to one end, and a second pair of differential transistors (NT3 and NT4) of a conductive type (PT1 and PT2), in which a source of each transistor is connected to the other end of the second current source (CS2), a drain of each transistor being connected to respective second output node (ND2) and the second inverted output node (NXD2), the input signal (Vin) and the output signal (Vout) being inputted to the gate of each transistor, and a second current mirror circuit (CM2) having a second pair of transistors (NT3 and NT4) of a first conductive type in which gates are mutually connected, wherein:

a first power voltage (VDD) is supplied to a source of each transistor constituting the second pair of transistors; a drain of each transistor is connected to respective second output node (ND2) and the second inverted output node (NDX2); of the transistors constituting the second pair of transistors (PT3 and PT4), a drain and a gate of the transistor connected to the second inverted output node (NXD2) are connected; the output section including a second drive transistor (PT01) of a first conductive type whose gate is connected to the second output node (ND2); and a first drive transistor (NT01) of a second conductive type in which the gate thereof is connected to the first output node (ND1), the drain thereof being connected to a drain of the second drive transistor (PT01), wherein a voltage of the drain is outputted as the output signal (Vout); when, of the transistors constituting the first pair of differential transistors (PT1 and PT2), the absolute value of a voltage between the gate and source of the transistor (PT1) whose gate is inputted with the input signal (Vin) is less than the absolute value of the threshold voltage of the transistor, the first auxiliary circuit (130) controls a gate voltage of the first drive transistor (PT01) by driving at least one of the first output node (ND1) and the first inverted output node (NXD1); and when, of the transistors constituting the second pair of differential transistors (NT3 and NT4), the absolute value of a voltage between the gate and source of the transistor (NT3) whose gate is inputted with the input signal (Vin) is less than the absolute value of the threshold voltage of the transistor, the second auxiliary circuit (140) controls a gate voltage of the first drive transistor (PT01) by driving at least one of the second output node (ND2) and the second inverted output node (NXD2).

In the present invention, if there is inputted an input signal in a range in which the first and the second pairs of differential transistors operate, the first and the second conductive type differential amplifying circuits carry out differential amplification of respective input signals and output signals and control the gate voltages of the first and the second drive transistors constituting the output circuit.

If there is inputted an input signal in a range in which the first pair of differential transistors operates and the second pair of differential transistors does not operate, the first conductive type differential amplifying circuit carries out differential amplification of the input signal and the output signal and controls the gate voltage of the first drive transistor constituting the output circuit. On the other hand, since each node of the second conductive type differential amplifying circuit becomes indefinite, the second auxiliary circuit drives at least one of the second output node and the second inverted output node of the second conductive type differential amplifying circuit, thereby controlling the gate voltage of the second drive transistor.

If there is inputted an input signal in a range in which the second pair of differential transistors does not operate and the first pair of differential transistors operates, the second conductive type differential amplifying circuit performs differential amplification of the input signal and the output signal and controls the gate voltage of the second drive transistor constituting the output circuit. On the other hand, since each node of the first conductive type differential amplifying circuit becomes indefinite, the first auxiliary circuit drives at least one of the first output node and the first inverted output node of the first conductive type differential amplifying circuit, thereby controlling the gate voltage of the first drive transistor.

By doing so, the gate voltage of the first and the second drive transistors constituting the output circuit can be controlled, thereby being able to provide a voltage follower circuit having a differential section whose reaction rate is faster than the output section.

Further, it is possible to eliminate generation of a through current arising from the input signal being in a range of the input insensitive zone. In addition, by eliminating the input insensitive zone of the input signal, it is not necessary to set up an offset in consideration of a scattering of the threshold voltage of the first and the second conductive type transistors. As a result, an arithmetic amplifying circuit may be formed with a voltage between the power voltage on the high potential side and the power voltage on the low potential side as an amplitude, thus enabling an operating voltage to be made narrow without lowering the drive capacity and further power consumption can be reduced. This means packing of a booster circuit and low-voltage of a manufacturing process, realizing low cost.

It should be noted that other elements (such as a switching element) may be set up between the first pair of differential transistors and a first current source, between a drain of each transistor of the first pair of differential transistors and a first output node or a first inverted node, between the second pair of differential transistors and a second current source, between a drain of each transistor of the second pair of differential transistors and a second output node or a second inverted output node, between drains of the first and the second drive transistors, between the first output node and the gate of the first drive transistor, and between the second output node and the gate of the second drive transistor Further, in an arithmetic amplifying circuit according to the present invention, the first auxiliary circuit (130) includes the first and the second current drive transistors (PA1 and PA2) of the first conductive type in which the first power voltage (VDD) is supplied to the source of each transistor, while the drain of each transistor being respectively connected to the first output node (ND1) and the first inverted output node (NXD1); and a first current control circuit (132) controlling gate voltages of the first and the second current drive transistors (PA1 and PA2) based on the input signal (Vin) and the output signal (Vout), wherein: when, of the transistors constituting the first pair of differential transistors (PT1 and PT2), the absolute value of the voltage between the gate and source of the transistor (PT1) whose gate is inputted with the input signal (Vin) is less than the absolute value of the threshold voltage of the transistor, the first current control circuit (132) may control the gate voltages of the first and the second current drive transistors (PA1 and PA2) by driving at least one of the first output node (ND1) and the first inverted output node (NXD1).

According to the present invention, by controlling the voltages of the first and the second current drive transistors, it is possible to drive the first output node or the first inverted output node with a simple configuration. As a result, the gate voltage of the first current drive transistor may be controlled with a simple configuration.

It should be noted that another element (for example, a switching element and the like) may be located between the drain of the first or the second current drive transistor and the first output node or the first inverted output node.

Further, in an arithmetic amplifying circuit according to the present invention, the second auxiliary circuit (140) includes the third and the fourth current drive transistors (NA3 and NA4) of the second conductive type in which the second power voltage (VSS) is supplied to the source of each transistor, while the drain of each transistor being respectively connected to the second output node (ND2) and second inverted output node (NXD2); and a second current control circuit (142) controlling gate voltages of the third and the fourth current drive transistors (NA3 and NA4) based on the input signal (Vin) and the output signal (Vout), wherein: when, of the transistors constituting the second pair of differential transistors (NT3 and NT4), the absolute value of a voltage between the gate and source of the transistor (NT3) whose gate is inputted with the input signal (Vin) is less than the absolute value of the threshold voltage of the transistor, the second current control circuit (142) may control the gate voltages of the third and the fourth current drive transistors (NA3 and NA4) by driving at least one of the second output node (ND2) and the second inverted output node (NXD2).

According to the present invention, by controlling the voltages of the third and the fourth current drive transistors, it is possible to drive the second output node or the second inverted output node with a simple configuration. As a result, the gate voltage of the second current drive transistor may be controlled with a simple configuration.

It should be noted that another element (for example, a switching element and the like) may be located between the drain of the third or the fourth current drive transistor and the second output node or the second inverted output node.

Further, in an arithmetic amplifying circuit according to the present invention, the first current control circuit (132) includes: a third current source (CS3) with the first power voltage (VDD) being supplied to one end; the third pair of differential transistors (NS5 and NS6) of the second conductive type, in which a source of each transistor is connected to the other end of the third current source (CS3), the input signal (Vin) and the output signal (Vout) being inputted to the gate of each transistor; and a fifth and a sixth current drive transistors (PS5 and PS6) of the first conductive type in which the first power voltage (VDD) is supplied to the source of each transistor, while the drain of each transistor being respectively connected to the drain of each transistor of the third pair of differential transistors (NS5, NS6), and to which the gate and the drain of each transistor is connected, wherein: of the transistors constituting the third pair of differential transistors, a drain of the transistor (NS5) whose gate is inputted with the input signal (Vin) is connected to the gate of the second current drive transistor (PA2); and of the transistors constituting the third pair of differential transistors, the drain of the transistor (NS6) whose gate is inputted with the output signal (Vout) may be connected to the gate of the first current drive transistor (PA1).

According to the present invention, if there is inputted an input signal in a range in which the first pair of differential transistors does not operate, through the first and the second current drive transistors controlled by the first current control circuit, it is possible to drive the first output node and the first inverted output node in an auxiliary manner with a simple configuration.

It should be noted that another element (for example, a switching element and the like) may be located between the source of each transistor constituting the third pair of differential transistors and the third current source, between the drain of each transistor constituting the third pair of differential transistors and a drain of the fifth or the sixth current drive transistor, or of transistors constituting the third pair of differential transistors, a drain of a transistor whose gate is inputted with the input signal and the gate of the second current drive transistor, or of transistors constituting the third pair of differential transistors, a drain of a transistor whose gate is inputted with the output signal and the gate of the first current drive transistor.

Further, in an arithmetic amplifying circuit according to the present invention, the second current control circuit (142) includes: a fourth current source (CS4) with the first power voltage (VDD) being supplied to one end; a fourth pair of differential transistors (PS7 and PS8) of the first conductive type, in which a source of each transistor is connected to the other end of the fourth current source (CS4), the input signal (Vin) and the output signal (Vout) being inputted to the gate of each transistor; and a seventh and an eighth current drive transistors (NS7 and NS8) of the second conductive type in which the second power voltage (VSS) is supplied to the gate and the source of each transistor, while the drain of each transistor being respectively connected to the drain of each transistor of the fourth pair of differential transistors (PS7 and PS8), and to which the gate and the drain of each transistor is connected, wherein: of the transistors constituting the fourth pair of differential transistors, a drain of the transistor (PS7) whose gate is inputted with the input signal (Vin) is connected to a gate of the fourth current drive transistor (NA2); and of the transistors constituting the fourth pair of differential transistors, the drain of the transistor (PS8) whose gate is inputted with the output signal (Vout) may be connected to a gate of the third current drive transistor (NA3).

According to the present invention, if there is inputted an input signal in a range in which the second pair of differential transistors does not operate, through the third and the fourth current drive transistors controlled by the second current control circuit, it is possible to drive the second output node and the second inverted output node in an auxiliary manner with a simple configuration.

It should be noted that other elements (for example, a switching element and the like) may be located between the source of each transistor constituting the fourth pair of differential transistors and the fourth current source, between the drain of each transistor constituting the fourth pair of differential transistors and a drain of the seventh or eighth current drive transistor, or of transistors constituting the fourth pair of differential transistors, a drain of a transistor whose gate is inputted with an input signal and the gate of the seventh current drive transistor, or of transistors constituting the fourth pair of differential transistors, a drain of a transistor whose gate is inputted with an output signal and the gate of the eighth current drive transistor.

Further, in an arithmetic amplifying circuit according to the present invention, current values of the first and the third current source (CS1 and CS3) at the time of operation may be equal, and current values of the second and the fourth current source (CS1 and CS3) at the time of operation may be equal.

According to the present invention, a balance of drain currents of the first and the second drain transistors may be maintained, so that leading or trailing end of an output signal may be evenly arranged, thus making it possible to stabilize the output and suppress oscillation.

Further, in an arithmetic amplifying circuit according to the present invention, the current value of each current source of the first to the fourth current sources (CS1-CS4) at the time of operation may be equal.

Further, in an arithmetic amplifying circuit according to the present invention, at least one of a ratio of current drive capacity of the first current drive transistor (PA1) to the current drive capacity of the sixth current drive transistor (PS6), the ratio of the current drive capacity of the second current drive transistor (PA2) to the current drive capacity of the fifth current drive transistor (PS5), the ratio of the current drive capacity of the third current drive transistor (NA3) to the current drive capacity of the eighth current drive transistor (NS8), and the ratio of the current drive capacity of the fourth current drive transistor (NA4) to the current drive capacity of the seventh current drive transistor (NS7) may be larger than 1.

According to the present invention, it is possible to reduce the current values of the current sources of the first and the second auxiliary circuits, thereby making it possible to lower power consumption.

Further, the present invention relates to a drive circuit for driving an electro-optical apparatus having a pixel electrode specified by a plurality of scanning lines, a plurality of data lines, a scanning line, and a data line, the drive circuit comprising an arithmetic amplifying circuit according to any of the foregoing set up per data line and a data voltage generating circuit generating a data voltage as an input signal to the arithmetic amplifying circuit.

According to the present invention, a drive circuit which can realize low power consumption at low cost without lowering the drive capacity may be provided.

Further, the present invention relates to a an adjustment method of a phase margin of an arithmetic amplifying circuit described above, wherein the larger the capacity of the capacitive load becomes, the less the resistance value of the resistance circuit is set, while the less the capacity of the capacitive load becomes, the larger the resistance value of the resistance circuit is set.

According to the present invention, oscillation may be prevented by having an optimum phase margin according to the load capacity of the capacitive load connected to the output of the arithmetic amplifying circuit.

BRIEF DESCRIPTION OF THE DRAWINGS

FIG. 5 is an explanatory diagram of a relationship between throughput rates of outputs of a differential section and an output section, and oscillation;

DETAILED DESCRIPTION

An embodiment according to the present invention will be described with reference to the drawings. It should be noted that the embodiment to be described below does not limit the scope of the present invention as claimed. Further, not all of the elements explained below are necessarily essential elements of the present invention.

1. Liquid Crystal Apparatus

Figure 1:
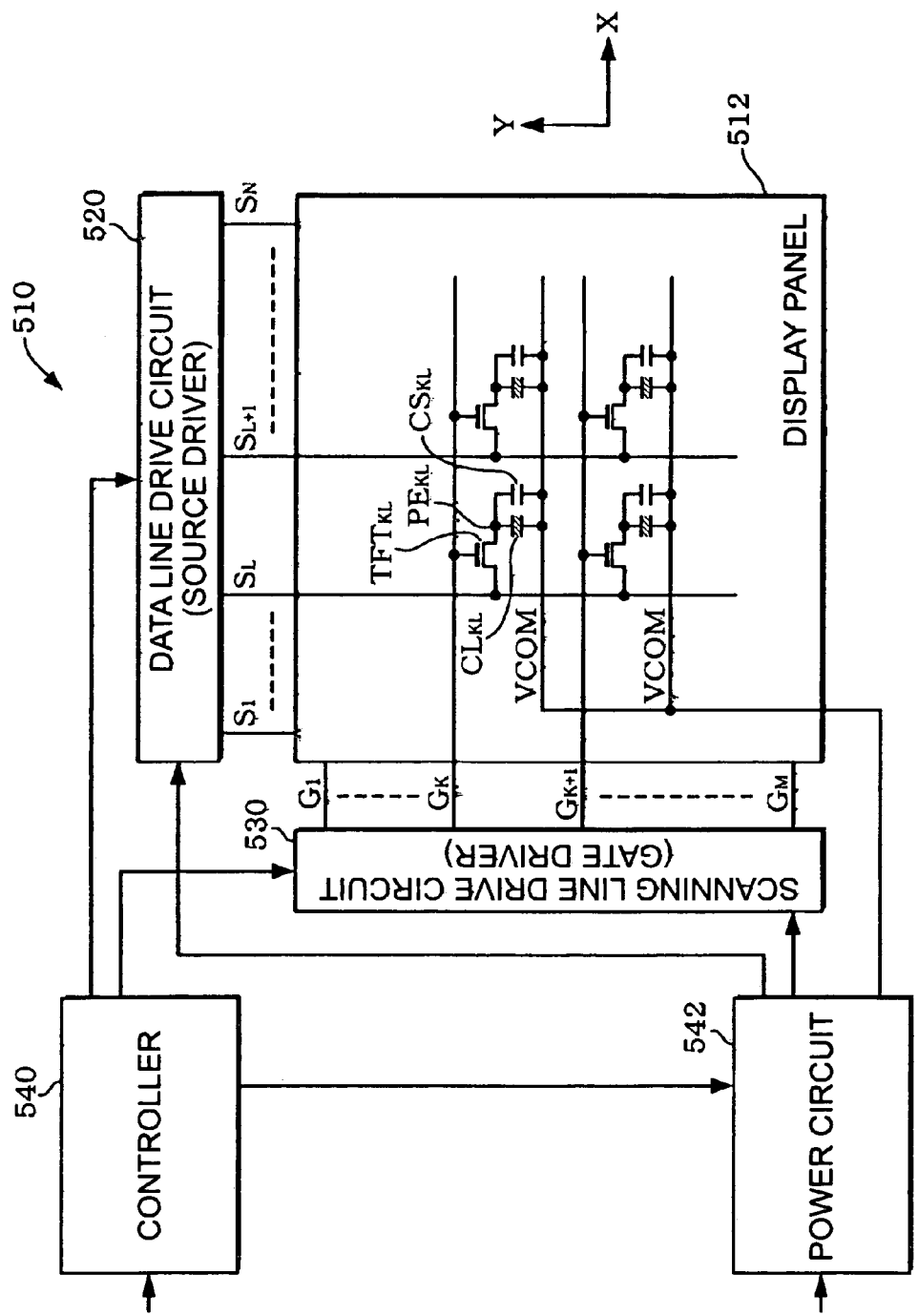
FIG. 1 is a block diagram of a liquid crystal apparatus to which an arithmetic amplifying circuit of the present embodiment has been applied.

FIG. 1 shows an example of a liquid crystal apparatus in a block diagram, to which an arithmetic amplifying circuit of the present embodiment has been applied.

This liquid crystal apparatus 510 (a display in a broad sense) includes a display panel 512 (a LCD (Liquid Crystal Display) panel in a narrow sense), a data line drive circuit 520 (a source driver in a narrow sense), a scanning line drive circuit 530 (a gate driver in a narrow sense), a controller 540, and a power circuit 542. It should be noted that all these circuit blocks need not be included in the liquid crystal apparatus 510 and that it may be configured so as to omit part of the circuit blocks.

The display panel 512 (an electro-optical apparatus in a broad sense) herein includes a plurality of scanning lines (gate lines in a narrow sense), a plurality of data lines (source lines in a narrow sense), and a pixel electrode to be specified by a scanning line and a data line. In this case, it is possible to configure a liquid crystal apparatus of an active matrix type by connecting a thin film transistor TFT (Thin Film Transistor, a switching element in a broad sense) to a data line and connecting the pixel electrode to this TFT.

More specifically, the display panel 512 is formed of an active matrix substrate (for example, a glass substrate). On this active matrix substrate, there are arranged scanning lines $G_1$-$G_M$ (M is a natural number greater than 2) arrayed in plurality in X direction in FIG. 1 and respectively extending in Y direction and a plurality of data lines $S_1$-$S_N$ (N is a natural number greater than 2) arrayed in plurality in X direction and respectively extending in Y direction. Further, at a position corresponding to an intersection between a scanning line $G_K$ ($1 \leq K \leq M$, K is a natural number) and a data line $S_L$ ($1 \leq L \leq N$, L is a natural number), there is installed a thin film transistor $TFT_{KL}$ (a switching element in a broad sense).

A gate electrode of the $TFT_{KL}$ is connected to the scanning line $G_K$, a source electrode of the $TFT_{KL}$ is connected to the data line $S_L$, and a drain electrode of the $TFT_{KL}$ is connected to a pixel electrode $PE_{KL}$. Between this pixel electrode $PE_{KL}$ and an opposite electrode VCOM (common electrode) which is opposite this pixel electrode by grasping the pixel electrode $PE_{KL}$ and a liquid crystal element, there are formed a liquid crystal quantity $CL_{KL}$ (liquid crystal element) and an auxiliary quantity $CS_{KL}$. Liquid crystals are sealed between the active matrix substrate, in which the $TFT_{KL}$, the pixel electrode $PE_{KL}$, and the like are formed, and the opposite substrate, in which the opposite electrode VCOM is formed, such that a transmission factor of the pixel changes according to an impressed voltage between the pixel electrode $PE_{KL}$ and the opposite electrode VCOM.

It should be noted that a voltage provided to the opposite electrode VCOM is generated by the power source circuit 542. Further, instead of forming the opposite electrode VCOM all over the opposite substrate, it may be formed in a strip shape to correspond to each scanning line.

The date line drive circuit 520 drives the data lines $S_1$-$S_N$ of the display panel 512 based on imaging data. On the other hand, the scanning line drive circuit 530 drives scanning sequentially over the scanning lines $G_1$-$G_M$ of the display panel 512.

The controller 540 controls the data line drive circuit t20, the scanning line drive circuit 530, and the power circuit 542 in accordance with a content set by a host such as an un-illustrated Central Processing Unit (CPU).

More specifically, the controller 640 supplies, for example, a vertical synchronous signal and a horizontal synchronous signal generated by setting an operating mode as well as internally, to the data line drive circuit 520 and the scanning line4 drive circuit 530, and controls polarity inversion timing of a voltage of the opposite electrode VCOM with respect to the power circuit 542.

The power circuit 542, based on a reference voltage supplied from the outside, generates various voltages (gradation voltages) necessary for driving the display panel 512 and the opposite electrode VCOM voltage.

It should be noted that while the configuration of the liquid crystal apparatus 510 includes the controller 540 in FIG. 1, the controller 540 may be placed outside the liquid crystal apparatus 510. Or together with the controller 540, the host may be included in the liquid crystal apparatus 510. Further, part or all of the data line drive circuit 520, the scanning line drive circuit 530, the controller 540, and the power circuit 542 may be formed on the display panel 512.

1.1 Data Line Drive Circuit

Figure 2:
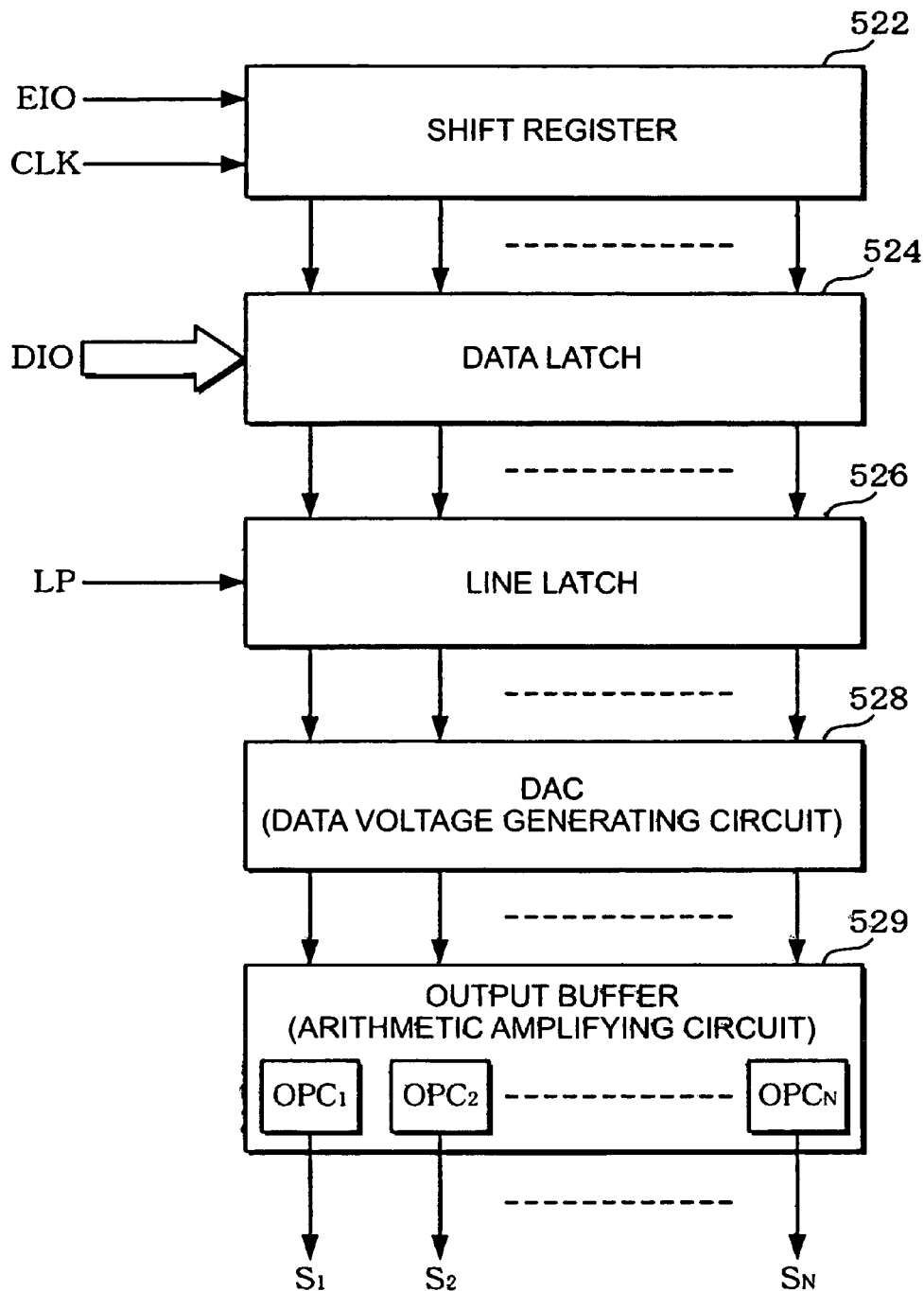
FIG. 2 is a diagram showing a configuration example of a date line drive circuit of FIG. 1.

A configuration example of the data line drive circuit 520 of FIG. 1 is shown in FIG. 2.

The data line drive circuit 520 (a drive circuit in a broad sense) includes a shift register 522, a data latch 524, a line latch 526, a DAC 528 (Digital Analog Circuit, a data generating circuit in a broad sense), and an output buffer 529 (an arithmetic amplifying circuit).

The shift register is set up corresponding to each data line, including a plurality of flip flops sequentially connected. This shift register 522 synchronizes with a clock signal CLK and holds an enable input/output signal EIO, then synchronizing with the clock signal CLK in sequence, shifts the enable input/output signal EIO to an adjacent flip flop.

In the data latch 542, imaging data (DIO) inputted from the controller 549, for example, in units of 18 bits (6 bits (gradation data)×3 (each color of RGB)). The data latch 524 latches this imaging data (DIO) in synchronization with the enable input/output signal EIO sequentially shifted by each flip flop of the shift register 522.

The line latch 526 synchronizes with the horizontal synchronous signal LP supplied from the controller 540 and latches imaging data in a unit of 1 horizontal scanning latched by the data latch 524.

The DAC 528 generates an analog data voltage to be supplied to each data line. Specifically, the DAC 528, based on digital imaging data from the line latch 526, selects either of the gradation voltages from the power circuit 542 and outputs an analog data voltage corresponding to the digital imaging data.

The output buffer 529, after buffering the data voltage from the DAC 528, outputs it to the data line and drives the data line. Specifically, the output buffer 529 includes arithmetic amplifying circuits $OPC_1$-$OPC_N$ of voltage follower connection provided per data line, each of these arithmetic amplifying circuits $OPC_1$-$OPC_N$ subjects the data voltage from the DAC 528 to impedance conversion and outputs it to each data line.

It should be noted that while the configuration in FIG. 2 is such that digital imaging data is subjected to digital/analog conversion to be outputted to the data lines via the output buffer 529, it may be so configured that an analog imaging signal may be held to be outputted to the data lines via the output buffer 529.

1.2 Scanning Line Drive Circuit

Figure 3:
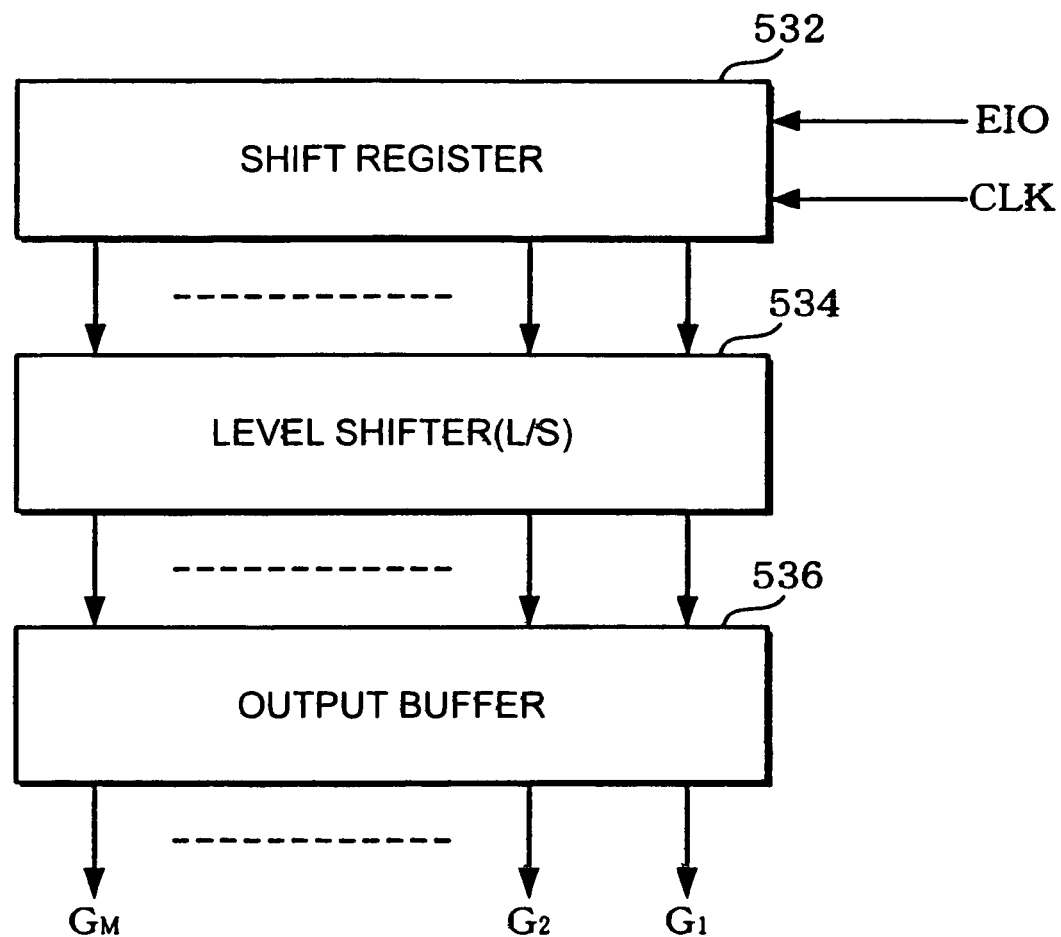
FIG. 3 is a diagram showing a configuration example of a scanning line drive circuit of FIG. 1.

FIG. 3 shows a configuration example of the scanning line drive circuit 530 of FIG. 1.

The scanning line drive circuit 530 includes a shift register 532, a level shifter 534, and an output buffer 536.

The shift register 532 is set up corresponding to each scanning line, including a plurality of flip flops sequentially connected. This shift register 532 synchronizes with the clock signal CLK and holds the enable input/output signal EIO, then synchronizing with the clock signal CLK in sequence, shifts the enable input/output signal EIO to an adjacent flip flop. At this point, the enable input/output signal EIO is a vertical synchronous signal supplied from the controller 540.

The level shifter 534 shifts a level of a voltage from the shift register 532 to a level of voltage corresponding to a liquid crystal device of the display panel 512 and transistor capacity of the TFT. As this level of voltage, for example, a high voltage level of 20V -50V is preferred.

The output buffer 536 subjects a scanning voltage shifted by the level shifter 534 to buffering, outputs it to a scanning line, and drives the scanning line.

2. Arithmetic Amplifying Circuit

Figure 4:
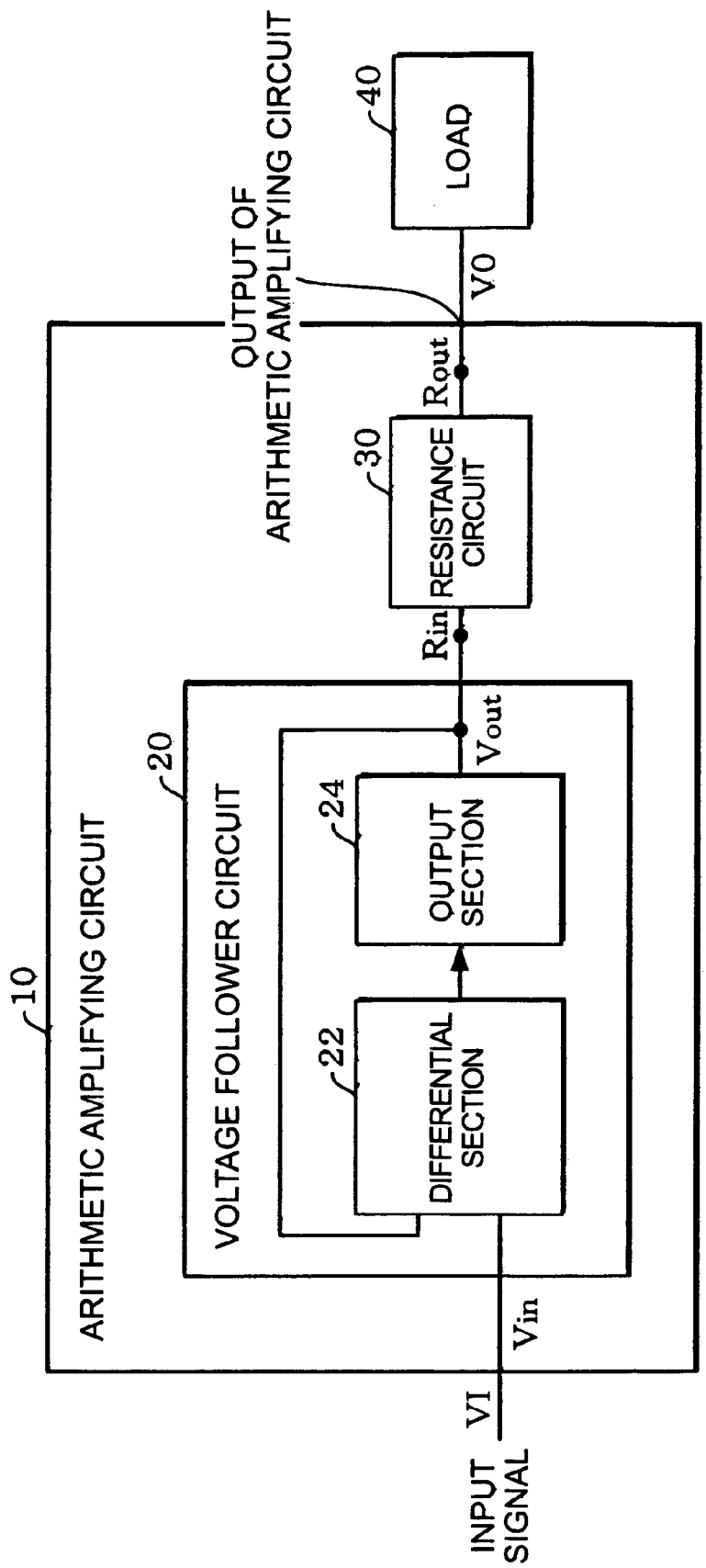
FIG. 4 is a block diagram of a configuration example of an arithmetic amplifying circuit of the present embodiment.

A block diagram of a configuration example of an arithmetic amplifying circuit 10 according to the present embodiment is shown in FIG. 4

An arithmetic amplifying circuit 10 according to the present embodiment includes a voltage follower circuit 20 as well as a resistance circuit 30, and drives a capacitive load 40. The voltage follower circuit 20 subjects the input signal Vin (VI) to impedance conversion. The resistance circuit 30 is serially connected between an output of the voltage follower circuit 20 and an output of the arithmetic amplifying circuit 10. The voltage follower circuit 20 includes a differential section 22 amplifying a differential between the input signal Vin (VI) and an output signal Vout of the voltage follower circuit 20, and the output section 24 outputting the output signal Vout of the voltage follower circuit based on the output of the differential section 22.

The arithmetic amplifying circuit 10 drives a load 40 connected to the output of the arithmetic amplifying circuit via the resistance circuit 30. In this manner, generally, the resistance circuit 30 is provided to the output of the voltage follower circuit 20 used for converting an infinitely large input impedance to small impedance, and the load 40 is driven via the resistance circuit 30. By doing so, it becomes possible to adjust a throughput rate (reaction rate) of the output section 24 with a resistance value of the resistance circuit 30 and a load capacity of the load 40. Consequently, to prevent oscillation determined by a relationship between the throughput rate (reaction rate) of the differential section 22 and the throughput rate of the output section 24 which feeds back its output to the differential section 22, a capacitor for phase compensation set up in the voltage follower circuit (the arithmetic amplifying circuit 10) may be made unnecessary.

A diagram explaining a relationship between the throughput rates of the outputs of the differential section 22 and the output section 24, and oscillation is shown in FIG. 5. By paying attention to a relationship between the throughput rates of the outputs of the differential section 22 and the output section 24, and a phase margin, is illustrated herein.

The arithmetic amplifying circuit 10 (the voltage follower circuit 20) oscillates when its phase margin becomes 0. The larger the phase margin, the more difficult it becomes to oscillate, and the less the phase margin becomes, the easier it becomes to oscillate. When the output of the output section 24 is fed back to the input of the differential section 22 like the voltage follower circuit 20, the phase margin is determined by the throughput rate (reaction rate of the differential section 22) of the output of the differential section 22 and the throughput rate (reaction rate of the output section 24) of the output of the output section 24.

At this point, the throughput rate of the output of the differential section 22 is a quantity of change per unit time of the output of the differential section 22 relative to a step change of the input to the differential section 22. In FIG. 4, for example, this is equivalent to a quantity of change per unit time of the output of the differential section 22 which changed and amplified a differential between the output signal Vout fed back from the output of the output section 24 and the input signal Vin (VI), after the input signal Vin (VI) was inputted.

Further, it is possible to consider the throughput rate of the output of the differential section 22 by substituting it with the reaction rate of the differential section 22. In this case, the reaction rate of the differential section 22 is equivalent to the time until the output of the differential section 22 changes relative to a change of the input to the differential section 22. In FIG. 4, this is equivalent to the time it takes to amplify a differential between the output signal Vout fed back from the output of the output section 24 and the input signal Vin (VI), after the input signal Vin (VI) is inputted, and to change the output of the differential section 22. The larger the throughput rate is, the faster the reaction rate becomes, and the less the throughput rate is, the slower the reaction rate becomes. Such reaction rate of the differential section 22 is determined, for example, by the current value of the current source of the differential section 22.

Further, the throughput rate of the output of the output section 24 is a quantity of change per unit time of the output relative to a step change of the input to the output section 24. In FIG. 4, this is equivalent to the time it takes, for example, after the output of the differential section 22 changes, until the output signal Vout changes following a change in the output of the differential section 22.

Further, it is possible to consider the throughput rate of the output of the output section 24 by substituting it with the reaction rate of the output section 24. In this case, the reaction rate of the output section 24 is equivalent to the time it takes until the output of the output section 24 changes relative to a change of the input to the output section 24. In FIG. 4, this is equivalent to the time it takes, for example, after the output of the differential section 22 changes, until the output signal Vout changes following a change in the output of the differential section 22. Such reaction rate of the output section 24 is determined, for example, by the load connected to the output of the output section 24.

Figure 6:
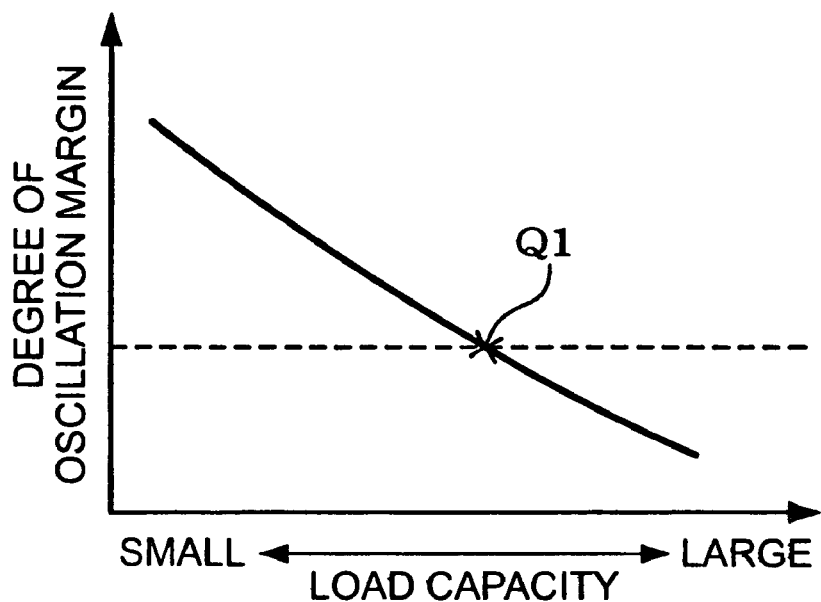
FIG. 6 is an explanatory diagram showing an example of change in the degree of oscillation margin in relation to load capacity.

When attention is paid to stability of the output signal Vout, it means that as the throughput rate of the output of the differential section 22 approaches the output of the outlet section 24, it becomes easier to oscillate while phase margin decreases. Consequently, if the throughput rate of the output of the differential section 22 is less than the throughput rate of the output of the output section 24 (the reaction rate of the differential section 22 slower than the reaction rate of the outlet section 24), the phase margin is large with the load being not connected when the load 40 is not connected, while, at the time of the load being connected, the throughput rate of the output of the outlet section 24 becomes less and the phase margin becomes larger. Namely, as shown in FIG. 6, when the load capacity of the load 40 grows large, the degree of oscillation margin corresponding to the phase margin decreases, and oscillation takes place at point Q1. In this case, if there is a sufficient degree of oscillation margin at the time of the load being not connected, by taking the load capacity into consideration, it is possible to prevent oscillation at the time of the load being connected.

Figure 7:
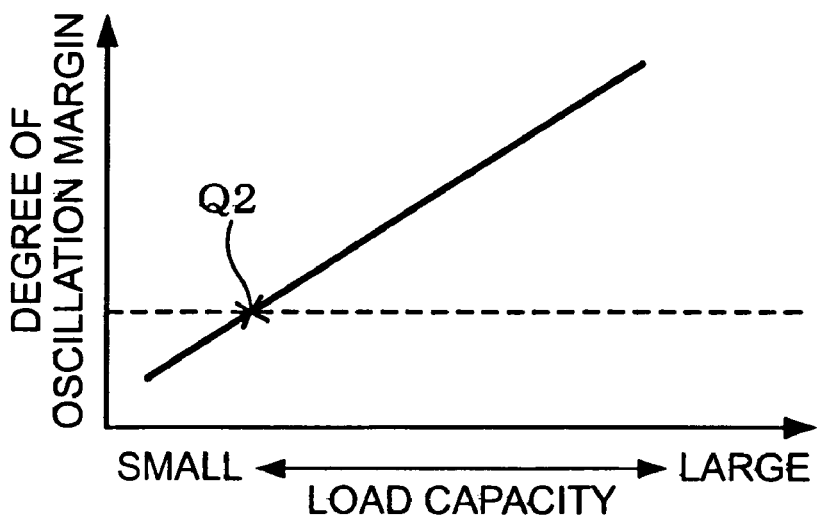
FIG. 7 is an explanatory diagram showing another example of change in the degree of oscillation margin in relation to load capacity.

Further, if the throughput rate of the output of the differential section 22 is larger than the throughput rate of the output of the output section 24 (the reaction rate of the differential section 22 faster than the reaction rate of the outlet section 24), the phase margin is small when the load is not connected, while, at the time of the load being connected, the throughput rate of the output of the outlet section 24 becomes less (the reaction rate of the differential section 22 slower) and the phase margin becomes large. Further, if the throughput rate of the output of the differential section 22 is the same (identical) as the throughput rate of the output of the output section 24, that is, if the reaction rate of the differential section 22 is the same (substantially identical) as the reaction rate of the outlet section 24, the phase margin is small when the load is not connected, while, at the time of the load being connected, the throughput rate of the output of the outlet section 24 becomes less (the reaction rate of the differential section 22 is slower) and the phase margin becomes large. Consequently, as shown in FIG. 7, when the load capacity of the load 40 grows large, the degree of oscillation margin decreases and oscillation takes place at point Q2. However, by making the degree of oscillation margin larger than the point Q2 when the load is not connected, the oscillation when the load is connected may be prevented with certainty.

2.1 Resistance Circuit

Figure 8A:
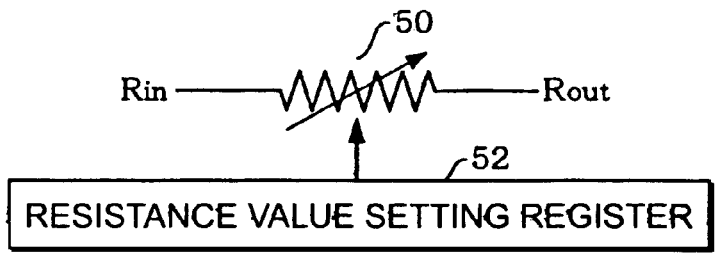
FIGS. 8A, B and C are diagrams showing configuration examples of a resistance circuit.

Configuration examples of the resistance circuit 30 are shown in FIGS. 8A, B, and C.

The resistance circuit 30 may include a variable resistance element 50 as shown in FIG. 8A. In this case, with the resistance value of the resistance circuit 30 and the load capacity value of the load 40, it becomes possible to adjust the throughput rate (the reaction rate of the outlet section 24) of the output of the output section 24. It should be noted that it is preferable to set a resistance value setting register 52 in which the controller 540 can set the value. It is preferable to be able to set the resistance value of the variable resistance element 50 depending on the setting content of the resistance value setting register 52.

Figure 8B:
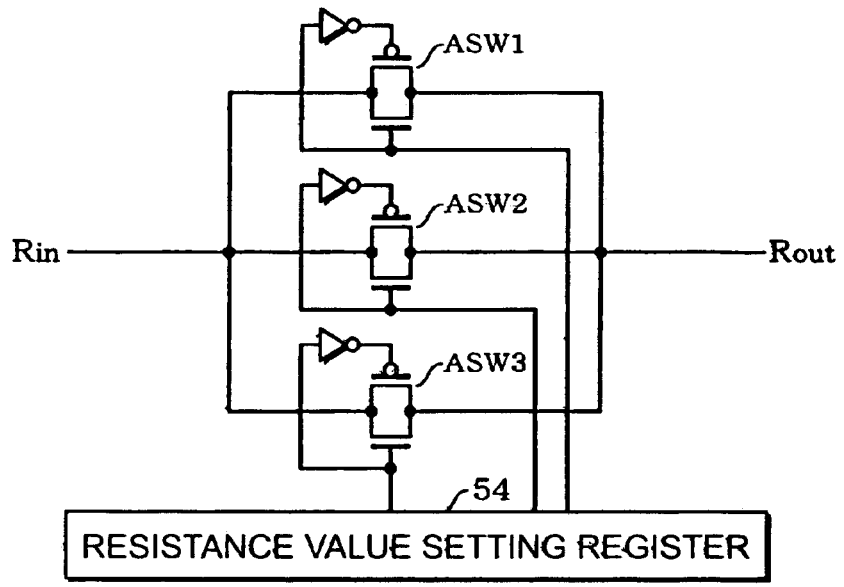

Further, the resistance circuit 30 may be constituted by analog switching elements ASW as shown in FIG. 8B. The analog switch ASW is such that a source and a drain of a p-type MOS transistor and a source and a drain of an n-type MOS transistor are respectively connected with each other. By turning on simultaneously the p-type MOS transistor and the n-type MOS transistor, through an on resistance of the p-type MOS transistor and the n-type MOS transistor, a resistance value of the resistance circuit 30 is determined.

More specifically, the resistance circuit may include a plurality of analog switching elements in which each analog switching element is connected in parallel. In FIG. 8B, three analog switching elements ASW1-ASW3 are connected in parallel, whereas two or more than four may be connected in parallel. In FIG. 8B, it is preferable to provide different resistance values of respective analog switching elements by respectively altering the sizes of transistors constituting respective analog switching elements. By doing so, it is possible to increase variations of resistance values that can be realized by the resistance circuit 30 through turning on at least one of the three analog switching elements ASW1-ASW3.

Further, it is preferable for the controller 540 to set up a resistance setting register 54 which can set its value. It is preferable to be able to turn on/off the analog switching elements ASW1-ASW3 depending on the setting content of the resistance value setting register 54.

Figure 8C:
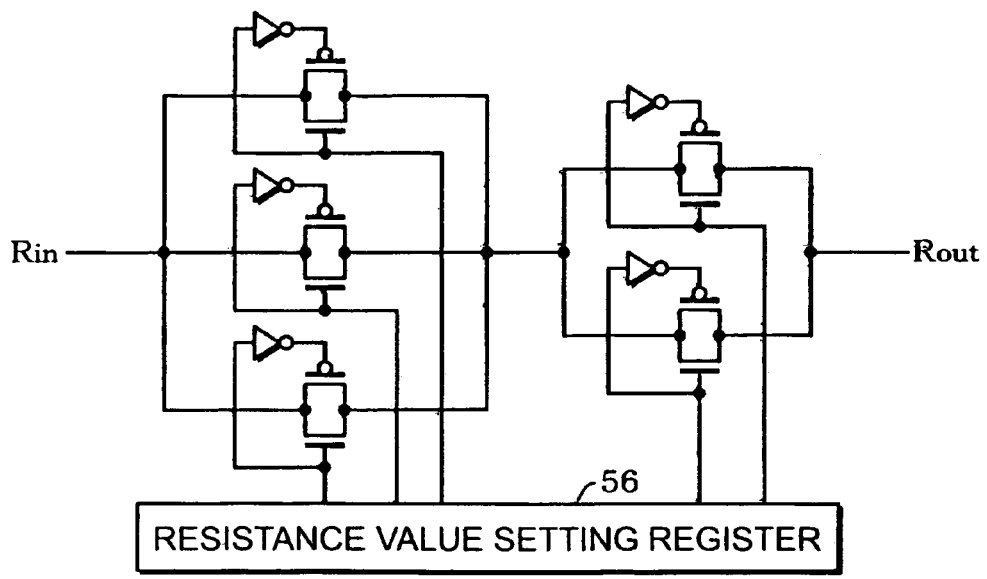

Further, as shown in FIG. 8C, the resistance circuit 30 may be adapted such that with a plurality of analog switching elements, in which each analog switching element is connected in parallel, as one unit, a plurality of units can be serially connected. In this case, it is preferable for the controller 540 to set up a resistance setting register 56 which can set its value. It is preferable to be able to turn on/off the analog switching elements ASW1-ASW3 depending on the setting content of the resistance value setting register 56.

When using the resistance circuit 30 as shown in FIG. 8A-C, it is preferable that the larger the capacity of the load 40 grows, the less the value of the resistance circuit 30 is set, while the less the capacity of the load 40 becomes, the larger the value of the resistance circuit 30 is set. This is because the charging time to the load is determined based on a product of the resistance value of the load circuit 30 multiplied by the load value, so that if a degree of oscillation margin over and above a certain level is provided, a gain becomes small.

2.2 Voltage Follower Circuit

In the present embodiment, it is possible to determine the stability of a circuit by a relative relationship between the throughput rate of the output of the differential section 22 and the throughput rate of the output of the output section 24 as mentioned above. It is preferable that as shown in FIG. 5, the throughput rate of the output of the differential section 22 is equal to the throughput rate of the output of the output section 24 or larger than the throughput rate of the output of the output section 24.

By employing the voltage follower circuit of the following configuration, it is possible to enlarge the throughput rate of the output of the differential section 22 and to realize a configuration dispensing with the capacitor for phase compensation.

Figure 9:
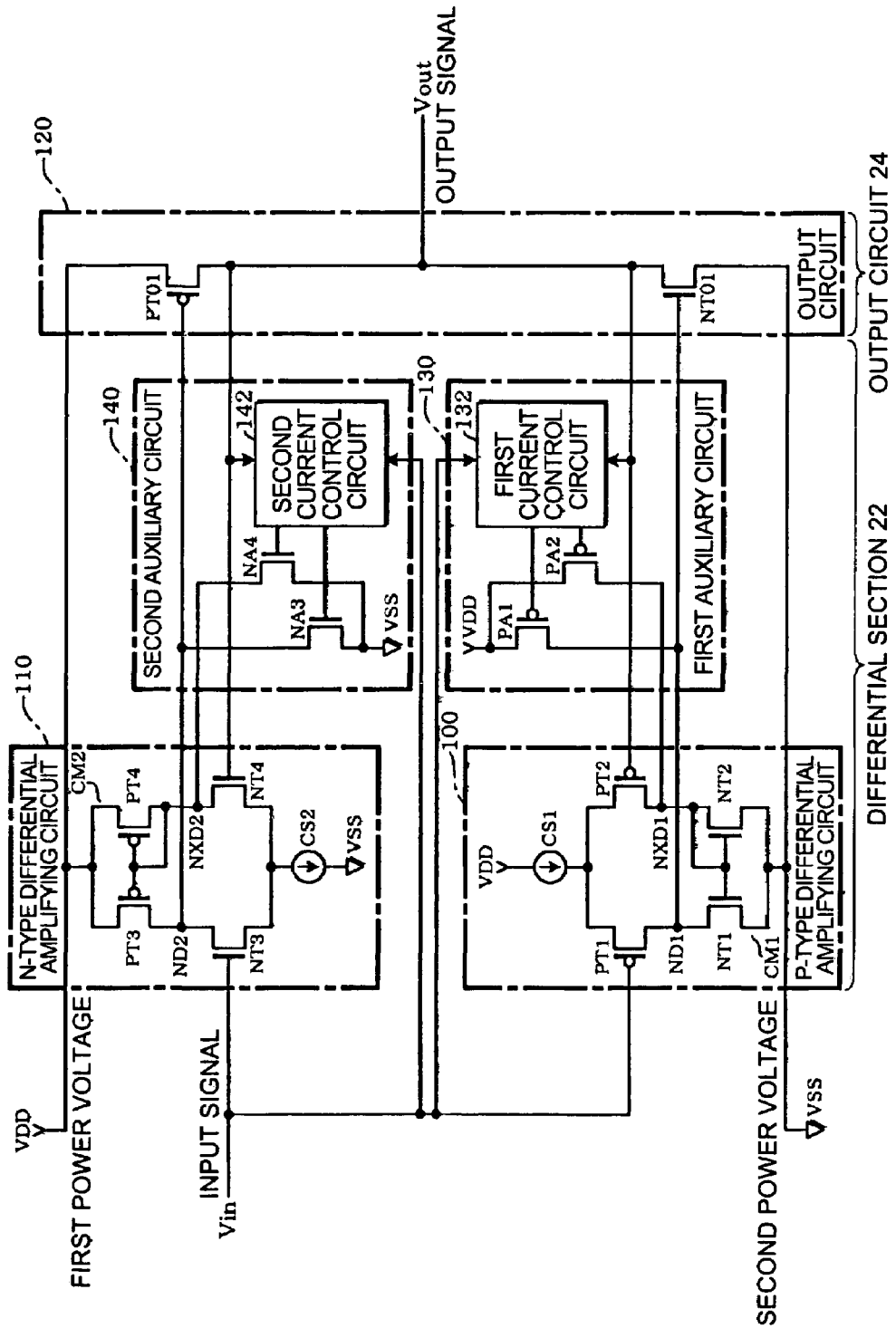
FIG. 9 is a diagram showing a configuration example of a voltage follower circuit in the present embodiment.

In FIG. 9, an example of a configuration of the voltage follower circuit 20 in the present embodiment is shown.

The differential section 22 of this voltage follower circuit 20 includes the p-type (for example, the first conductive type) differential amplifying circuit 100 and the n-type (for example, the second conductive type) differential amplifying circuit 110. Further, the output section 24 of the voltage follower circuit 20 includes the output circuit 120. The p-type differential amplifying circuit 100, the n-type differential amplifying circuit 110, and the output circuit 120 has a voltage between the power voltage VDD (a first power voltage in a broad sense) on the high potential side and the power voltage VSS (a second power voltage) on the low potential side as the operating voltage.

The p-type differential amplifying circuit 100 amplifies a differential between the input signal Vin and the output signal Vout. The p-type differential amplifying circuit 100 has an output node ND1 (the first output node) and an inverted output node NXD1 (the first inverted output node), outputting a voltage corresponding to the differential between the input signal Vin and the output signal Vout to between the output node ND1 and the inverted output node NXD1.

This p-type differential amplifying circuit 100 has a first current mirror circuit CM1 and a first pair of p-type (a first conductive type) differential transistors. The first pair of p-type differential transistors includes p-type metal oxide semiconductor (hereinafter abbreviated as MOS) transistors (hereinafter a MOS transistor abbreviated as simply a transistor) PT1 and PT2. A source of each transistor of the p-type transistors PT1 and PT2 is connected to a first current source CS1, while, at the same time, the input signal Vin and the output signal Vout are inputted to a gate of each transistor. Drain currents of the p-type transistors PT1 and PT2 are generated by the first current mirror circuit CM1. The input signal Vin is inputted to the gate of the p-type transistor PT1. The drain of the p-type transistor PT1 becomes the output node ND1 (a first output node). The drain of the p-type transistor PT2 becomes the inverted output node NXD1 (a first inverted output node).

The n-type differential amplifying circuit 110 amplifies a differential between the input signal Vin and the output signal Vout. The n-type differential amplifying circuit 110 has an output node ND2 (a second output node) and an inverted output node NXD2 (a second inverted output node), outputting a voltage corresponding to the differential between the input signal Vin and the output signal Vout to between the output node ND2 and the inverted output node NXD2.

This n-type differential amplifying circuit 110 has a second current mirror circuit CM2 and a second pair of p-type (a second conductive type) differential transistors. The second pair of p-type differential transistors includes n-type transistors NT3 and NT4. A source of each transistor of the n-type transistors NT3 and NT4 is connected to a second current source CS2, while, at the same time, the input signal Vin and the output signal Vout are inputted to a gate of each transistor. Drain currents of the n-type transistors NT3 and NT4 are generated by the second current mirror circuit CM2. The input signal Vin is inputted to the gate of the n-type transistor NT3. The drain of the n-type transistor NT3 becomes the output node ND2 (the second output node). The drain of the n-type transistor NT4 becomes the inverted output node NXD2 (the second inverted output node).

The output circuit 120 generates the output signal Vout based on a voltage of the output node ND1 (the first output node) of the p-type differential amplifying circuit 100 and a voltage of the output node ND2 (the second output node) of the n-type differential amplifying circuit 110.

This output circuit 120 includes an n-type (the second conductive type) first drive transistor NT01 and a p-type (the first conductive type) second drive transistor PT01. A gate (voltage) of the first drive transistor NT01 is controlled based on a voltage of the output node ND1(the first output node) of the p-type differential amplifying circuit 100. A gate voltage) of the second drive transistor PT01 is controlled based on a voltage of the output node (ND2) (the second output node) of the n-type differential amplifying circuit 110. A drain of the second drive transistor PT01 is connected to the drain of the first drive transistor. The output circuit 120 outputs a drain voltage of the first drive transistor NT01 (a drain voltage of the second drive transistor PT01) as the output signal Vout.

Further, a voltage follower circuit in the present embodiment, by including the first and the second auxiliary circuits 130 and 140, eliminates an input insensitive zone, suppresses a through current, and charges at high speed the gate voltages of the first and the second transistors PT01 and PT02, thus realizing high speed operation of the differential section 22. As a result, without expanding a range of the operating voltage unnecessarily, the through current is held down to realize low power consumption and high speed.

At this point, based on the input signal Vin and the output signal Vout, the first auxiliary circuit 130 drives at least one of the output node ND1 (the first output node) and the inverted output node NXD1 (the first inverted output node) of the p-type differential amplifying circuit 100. Further, based on the input signal Vin and the output signal Vout, the second auxiliary circuit 130 drives at least one of the output node ND2 (the second output node) and the inverted output node NXD2 (the second inverted output node) of the n-type differential amplifying circuit 100.

When the absolute value of a voltage between a gate and a source of an p-type transistor PT1 (of the transistors constituting a pair of the first differential transistors, a transistor whose gate is inputted with the input signal Vin) is less than the absolute value of a threshold voltage of the p-type transistor PT1, the first auxiliary circuit 130 controls the gate voltage of the first drive transistor NT01 by driving at least one of the output node ND1 (the first output node) and the inverted output node NXD1 (the first inverted output node).

Further, when the absolute value of a voltage between a gate and a source of an n-type transistor NT3 (of the transistors constituting a pair of the second differential transistors, a transistor whose gate is inputted with the input signal Vin) is less than the absolute value of a threshold voltage of the n-type transistor NT3, the second auxiliary circuit 140 controls the gate voltage of the second drive transistor PT01 by driving at least one of the output node ND2 (the second output node) and the inverted output node NXD2 (the second inverted output node).

Figure 10:
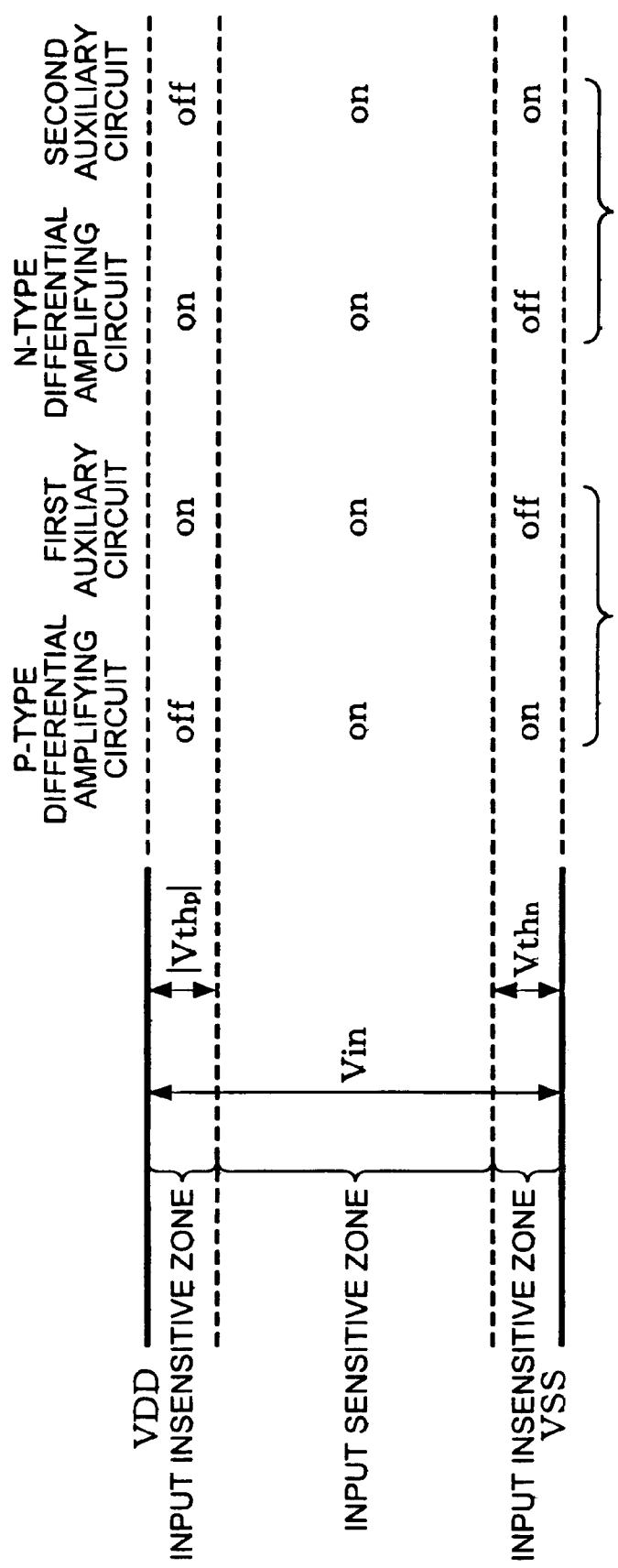
FIG. 10 is a diagram explaining operation of a voltage follower circuit shown in FIG. 9.

A diagram explaining the operation of the voltage follower circuit 20 shown in FIG. 9 is shown in FIG. 10.

At this point, the power voltage on the high potential side is VDD, the power voltage on the low potential side is VSS, the input signal voltage is Vin, the threshold voltage of the p-type transistor is Vthp, and the threshold of the n-type transistor NT3 is Vth.

In a formula $VDD \geqq Vin > VDD > -|Vthp|$, the p-type transistor is off and the n-type transistor is on. If the p-type transistor operates according to the gate voltage in a cut-off area, a linear area, or a saturated area, the p-type transistor being off means the cut-off area. Likewise, if the n-type transistor operates according to the gate voltage in a cut-off area, a linear area, or a saturated area, the n-type transistor being on means the linear area or the saturated area. Consequently, in $VDD \geqq Vin > VDD > -|Vthp|$, the p-type differential amplifying circuit 100 does not operate (off), and the n-type differential amplifying circuit 110 operates (on). Thereupon, operation of the first auxiliary circuit 130 is turned on (at least one of the output node ND1 (the first output node) and the inverted output node NXD1 (the first inverted output node) is driven), and operation of the second auxiliary circuit 140 is turned off (at least one of the output node ND2 (the second output node) and the inverted output node NXD2 (the second inverted output node) are not driven). By driving the output node ND1 (inverted output node NXD1) of the p-type differential amplifying circuit 100 by the first auxiliary circuit 130 in a range in which the p-type differential amplifying circuit 100 does not operate, the voltage of the output node ND1 will not become unstable even in relation to the input signal Vin in a range of the input insensitive zone for the first pair of differential transistors of the p-type differential amplifying circuit 100.

In $VDD-|Vthp"| > Vin \leqq Vthn+VSS$, the p-type transistor is on and the n-type transistor is off. If the p-type transistor operates according to the gate voltage in the cut-off area, the linear area, or the saturated area, the p-type transistor being on means the linear area or the saturated area. Consequently, the p-type differential amplifying circuit 100 operates (on), and the n-type differential amplifying circuit 110 does not operate (off). In this case, operation of the first auxiliary circuit 130 is turned on or off, and operation of the second auxiliary circuit 140 is turned on or off. Namely, since the p-type differential amplifying circuit 100 and the n-type differential amplifying circuit 110 go into operation, the output nodes ND1 and ND2 do not reach an unstable condition and the output signal Vout is outputted by the output circuit 120. Accordingly, the first and the second auxiliary circuits 130 and 140 may be permitted to operate or may not be permitted to operate. In FIG. 10, the operation is turned on.

In Vthn+VSS≧Vin≧VSS, the p-type transistor and the n-type transistor are off. If the n-type transistor operates according to the gate voltage in the cut-off area, the linear area, or the saturated area, the n-type transistor being off means the cut-off area. Consequently, the n-type differential amplifying circuit 110 does not operate (off), and the p-type differential amplifying circuit 110 operates (on). Thereupon, operation of the second auxiliary circuit 140 is turned on (at least one of the output node ND2 (the second output node) and the inverted output node NXD2 (the second inverted output node) is driven), and operation of the first auxiliary circuit 130 is turned off. In this manner, by means of driving the output node ND2 (the inverted output node NXD2) of the n-type differential amplifying circuit 110 by the second auxiliary circuit 140 in a range in which the n-type differential amplifying circuit 110 does not operate, the voltage of the output node ND2 will not become unstable even in relation to the input signal Vin in a range of the input insensitive zone for the second pair of differential transistors of the n-type differential amplifying circuit 110.

As mentioned above, the gate voltages of the first and the second drive transistors constituting the output circuit can be controlled, thereby being able to eliminate generation of an unnecessary through current arising from the input signal being in a range of the input insensitive zone. In addition, by eliminating the input insensitive zone of the input signal Vin, it is not necessary to set up an offset in consideration of scatterings of the threshold voltage Vthp of the p-type transistor and the threshold voltage Vthn of the n-type type transistor. As a result, a voltage follower circuit 20 may be formed with a voltage between the power voltage VDD on the high potential side and the power voltage VSS on the low potential side as an amplitude, thus enabling an operating voltage to be made narrow without lowering the drive capacity and power consumption to be further reduced. This means packing of a booster circuit and low voltage of a manufacturing process, realizing low cost.

Since the output nodes ND1 and ND2 are driven by the first and the second auxiliary circuits 130 and 140, a high speed reaction rate of the differential section 22 may be realized, while a phase compensation capacitor may be made unnecessary. Further, by decreasing the current drive capacity of the first and the second drive transistors PT01 and NT01 of the output section 24 concurrently, a low speed reaction rate of the output section 24 may be realized.

An example of a configuration of a voltage follower circuit in the present embodiment will be described in detail as follows.

In FIG. 9, the p-type differential amplifying circuit 100 includes the first current source CS1, the first pair of differential transistors mentioned above, and the first current mirror circuit CM1. To one end of the first current source CS1, there is supplied the power voltage VDD (the first power voltage) on the high potential side. To the other end of the first current source CS1, there are connected sources of the p-type transistors PT1 and PT2 constituting the first pair of differential transistors mentioned above.

The first current mirror circuit CM1 includes the first pair of n-type transistors (the second conductive type) whose gates are mutually connected. This first pair of transistors includes the n-type transistors NT1 and NT2. To the source of each transistor of the n-type transistors NT1 and NT2, there is supplied the power voltage VSS (the second power voltage) on the low potential side. The drain of the n-type transistor NT1 is connected to the output node ND1 (the first output node). The drain of the n-type transistor NT2 is connected to the inverted output node NXD1 (the first inverted output node). The drain and the source of the n-type transistor NT2 (of the transistors constituting the first pair of differential transistors, the transistor connected to the inverted output node NXD1) are connected.

Further, the n-type differential amplifying circuit 110 includes the second current source CS2, the second pair of differential transistors mentioned above, and the second current mirror circuit CM2. To one end of the second current source CS2, there is supplied the power voltage VSS (the second power voltage) on the high potential side. To the other end of the second current source CS2, there are connected sources of the n-type transistors NT3 and NT4 constituting the second pair of differential transistors mentioned above.

The second current mirror circuit CM2 includes the second pair of p-type transistors (the first conductive type) whose gates are mutually connected. This second pair of transistors includes the p-type transistors PT3 and PT4. To the source of each transistor of the p-type transistors PT3 and PT4, there is supplied the power voltage VDD (the first power voltage) on the high potential side. The drain of the p-type transistor PT3 is connected to the output node ND2 (the second output node). The drain of the p-type transistor PT4 is connected to the inverted output node NXD2 (the second inverted output node). The drain and the source of the p-type transistor PT4 (of the transistors constituting the second pair of differential transistors, the transistor connected to the inverted output node NXD2) are connected.

Further, the first auxiliary circuit 130 may include the first and the second p-type (the first conductive type) current drive transistors PA1 and PA2 and the first current control circuit 132. To a source of each transistor of the first and the second current drive transistors PA1 and PA2, there is supplied the power voltage VDD (the first power voltage) on the high potential side. The drain of the first current drive transistor PA1 is connected to the output node ND1 (the first output node). The drain of the second current drive transistor PA1 is connected to the inverted output node NXD2 (the first inverted output node).

The first current control circuit 132, based on the input signal (Vin) and the output signal (Vout), controls the gate voltages of the first and the second current drive transistors PA1 and PA2. More specifically, when, of the transistors constituting the first pair of differential transistors (PT1 and PT2), a voltage (absolute value) between the gate and source of a p-type transistor PT1 whose gate is inputted with the input signal (Vin) is less than a threshold voltage (absolute value) of the transistor, as the first current drive circuit 132 drives at least one of the output node ND1 (first output node) and the inverted output node NXD1 (first inverted output node), it controls the gate voltages of the first and the second current drive transistors PA1 and PA2.

Further, the second auxiliary circuit 140 may include the third and the fourth n-type (the second conductive type) current drive transistors NA3 and NA4 and the second current control circuit 142. To a source of each transistor of the third and the fourth current drive transistors NA3 and NA4, there is supplied the power voltage VSS (the second power voltage) on the low potential side. The drain of the third current drive transistor NA3 is connected to the output node ND2 (the second output node). The drain of the fourth current drive transistor NA4 is connected to the inverted output node NXD2 (the second inverted output node).

The second current control circuit 142, based on the input signal (Vin) and the output signal (Vout), controls the gate voltages of the third and the fourth current drive transistors NA3 and NA4. More specifically, when, of the transistors constituting the second pair of differential transistors, an absolute value of the voltage between the gate and source of the n-type transistor NT3 whose gate is inputted with the input signal (Vin) is less than an absolute value of a threshold voltage of the transistor, as the second current drive circuit 142 drives at least one of the output node ND2 (the second output node) and the inverted output node NXD2 (the second inverted output node), it controls the gate voltages of the third and the fourth current drive transistors NA3 and NA4.

In FIG. 9, the reaction rate of the differential section 22 is equivalent to the time it takes from a change in the input signal Vin until the gate voltages of the first and the second drive transistors PTO1 and NTO1 change and reach a specified level. Further, the reaction rate of the output section 24 is equivalent to the time it takes from a change in the gate voltages of the first and the second drive transistors PTO1 and NTO1 until the output signal Vout changes and reaches a specified level.

Figure 11:
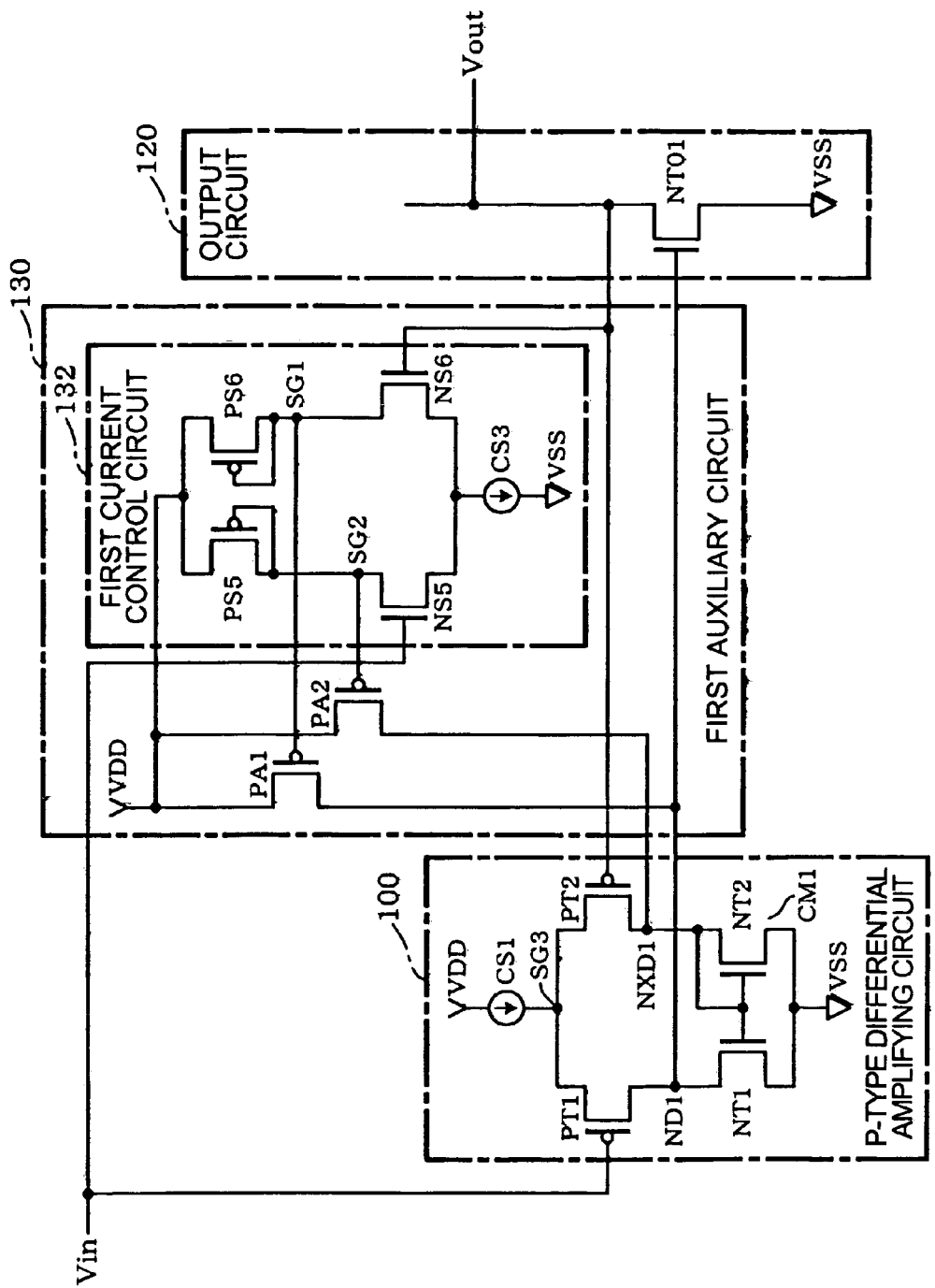
FIG. 11 is a circuit diagram of a configuration example of a first current control circuit.

A configuration example of the first current drive circuit 132 is shown in FIG. 11. However, like parts of the voltage follower circuit 20 shown in FIG. 9 are given like reference numerals with explanation omitted as appropriate.

The first current drive circuit 132 includes the third current source CS3, the third pair of n-type (the second conductive type) differential transistors, and the fifth and the sixth p-type (the first conductive type) current drive transistors PS5 and PS6.

To one end of a third current source CS3, there is supplied the power voltage VSS (the second power voltage) on the low potential side.

The third pair of differential transistors includes n-type transistors NS5 and NS6. A source of each transistor of the n-type transistors NS5 and NS6 is connected to the other end of the third current source CS3. To a gate of the n-type transistor NS5, there is inputted the input signal Vin. To a gate of the n-type transistor NS6, there is inputted the output signal Vout.

To a source of each transistor of the fifth and the sixth current drive transistors PS5 and PS6, there is supplied the power voltage VDD (the first power voltage) on the high potential side. A drain of the fifth current drive transistor PS5 is connected to the drain of the n-type differential transistor NS5 constituting the third pair of differential transistors. A drain of the sixth current drive transistor PS6 is connected to the drain of the n-type transistor NS6 constituting the third pair of differential transistors. The gate and the drain of the fifth current drive transistor PS5 are connected. The drain and the source of the sixth current drive transistor PS6 are connected.

The drain (or the drain of the fifth current drive transistor PS5) of the n-type transistor NS5 (of the transistors constituting the third pair of differential transistors, a transistor whose gate is inputted with the input signal Vin) is connected to the gate of the second current drive transistor PA2. Further, the drain (or the drain of the sixth current drive transistor PS6) of the n-type transistor N36 (of the transistors constituting the third pair of differential transistors, a transistor whose gate is inputted with the output signal Vout) constituting the third pair of differential transistors is connected to the gate of the first current drive transistor PA1.

Namely, the first and the sixth current drive transistors PA1 and PS6 constitute the current mirror circuit. Likewise, the second and the fifth current drive transistors PA2 and PS5 constitute the current mirror circuit.

Figure 12:
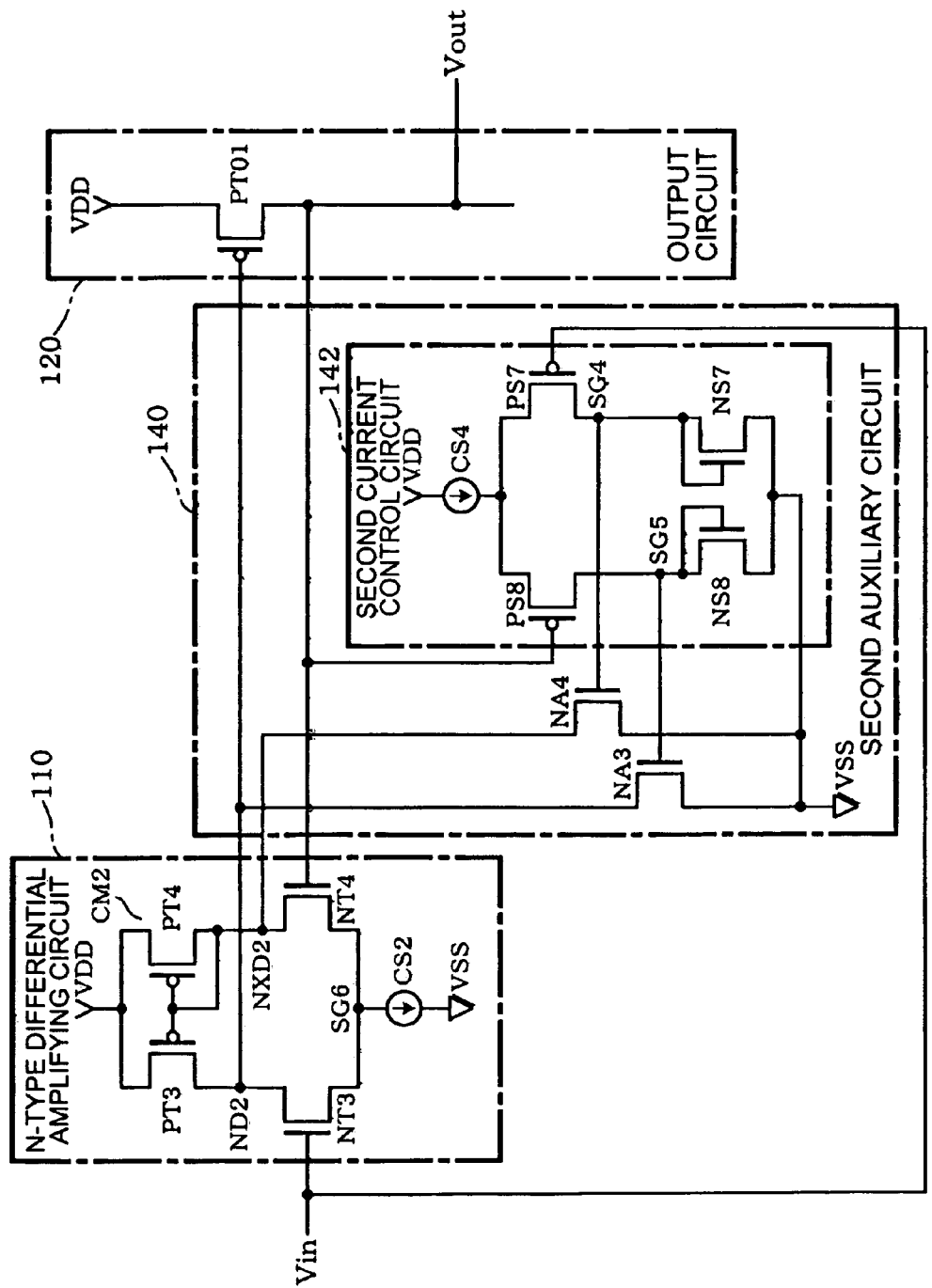
FIG. 12 is a circuit diagram of a configuration example of a second current control circuit.

A configuration example of the second current control circuit 142 is shown in FIG. 12. However, like parts of the voltage follower circuit 20 are given like reference numerals with explanation omitted as appropriate.

The second current drive circuit 142 includes the fourth current source CS4, the fourth pair of p-type (the first conductive type) differential transistors, and the seventh and the eighth n-type (the second conductive type) current drive transistors NS7 and NS8.

To one end of a fourth current source CS4, there is supplied the power voltage VDD (the first power voltage) on the high potential side.

The fourth pair of differential transistors includes p-type transistors PS7 and PS8. A source of each transistor of the p-type transistors PS7 and PS8 is connected to the other end of the fourth current source CS4. To a gate of the p-type transistor PS7, there is inputted the input signal Vin. To a gate of the p-type transistor PS8, there is inputted the output signal Vout.

To a source of each transistor of the seventh and the eighth current drive transistors NS7 and NS8, there is supplied the power voltage VSS (the second power voltage) on the high potential side. A drain of the seventh current drive transistor NS7 is connected to the drain of the p-type differential transistor PS7 constituting the fourth pair of differential transistors. A drain of the eighth current drive transistor NS8 is connected to the drain of the p-type transistor PS8 constituting the fourth pair of differential transistors. The gate and the drain of the seventh current drive transistor NS7 are connected. The drain and the source of the eighth current drive transistor NS8 are connected.

The drain (or the drain of the seventh current drive transistor NS7) of the p-type transistor PS7 (of the transistors constituting the fourth pair of differential transistors, a transistor whose gate is inputted with the input signal Vin) is connected to the gate of the fourth current drive transistor NA4. Further, the drain (or the drain of the eighth current drive transistor NS8) of the p-type transistor PS8 (of the transistors constituting the fourth pair of differential transistors, a transistor whose gate is inputted with the output signal Vout) constituting the fourth pair of differential transistors is connected to the gate of the third current drive transistor NA3.

Namely, the third and the eighth current drive transistors NA3 and NS8 constitute the current mirror circuit. Likewise, the fourth and the seventh current drive transistors NA4 and NS7 constitute the current mirror circuit.

Next, assuming that the first auxiliary circuit 130 has the first current drive circuit 132 shown in FIG. 6 and the second auxiliary circuit 140 has the second current drive circuit 142 whose configuration is shown in FIG. 12, operation of the voltage follower circuit 20 whose configuration is shown in FIG. 9 will be described.

First, when Vthn+VSS≧Vin≧VSS, the p-type differential amplifying circuit 100, as the p-type transistor PT1 is turned on, performs proper operation, while, as for the n-type differential amplifying circuit 110, since the n-type transistor NT3 does not operate, a voltage of each node of the n-type differential amplifying circuit becomes indefinite.

At this point, if attention is paid to the second auxiliary circuit 140, since the p-type transistor PS7 is turned on with a decrease in impedance, the gate voltage of the fourth current drive transistor NA4 rises. As a result, impedance of the fourth current drive transistor NA4 decreases. Namely, the fourth current drive transistor NA4 drives the inverted output node NXD2 and pulls in a current, and a potential of the inverted output node NXD2 decreases. Consequently, impedance of the p-type transistor PT3 decreases, while a potential of the output node ND2 increases. Impedance of the second drive transistor PTO1 of the output circuit 120 increases, while a potential of the output signal Vout decreases. As a result of this, impedance of the p-type transistor PS8 decreases, while the gate voltage of the third current drive transistor NA3 rises. Consequently, impedance of the third current drive transistor NA3 decreases, while the potential of the output node ND2 decreases.

In this manner, a result of decreasing the impedance of the p-type transistor PT3 and thus raising the potential of the output node ND2 is fed back, thereby decreasing the impedance of the third current drive transistor NA3 to decrease the potential of the output node ND2. As a result, there is obtained a state of equilibrium in which the voltage of the input signal Vin and the voltage of the output signal Vout are substantially equal, and the gate voltage of the second drive transistor PTO1 is defined at the optimum point.

Next, when VDD≧Vin>VDD>−|Vthp|, there is an operation reverse to the foregoing. Namely, as the n-type transistor NT3 is turned on, the n-type differential amplifying circuit 110 performs proper operation, while, as for the p-type differential amplifying circuit 100, since the p-type transistor PT1 does not operate, a voltage of each node of the p-type differential amplifying circuit 100 becomes indefinite.

At this point, if attention is paid to the first auxiliary circuit 130, since the n-type transistor NS5 is turned on with a decrease in impedance, the gate voltage of the second current drive transistor PA2 decreases. As a result, impedance of the second current drive transistor PA2 decreases. Namely, the second current drive transistor PA2 drives the inverted output node NXD1 and supplies a current and a potential of the inverted output node NXD1 rises. Consequently, impedance of the n-type transistor NT2 decreases, so that a potential of the output node ND1 decreases. Impedance of the first drive transistor NTO1 of the output circuit 120 increases, so that a potential of the output signal Vout increases. As a result of this, impedance of the n-type transistor NS6 decreases. Consequently, impedance of the first current drive transistor PA1 decreases, while the potential of the output node ND1 increases.

In this manner, a result of decreasing the impedance of the n-type transistor NT2 and thus diminishing the potential of the output node ND1 is fed back, thereby decreasing the impedance of the first current drive transistor PA1 to increase the potential of the output node ND1. As a result, there is obtained a state of equilibrium in which the voltage of the input signal Vin and the voltage of the output signal Vout are substantially equal, and the gate voltage of the first drive transistor NTO1 is defined at the optimum point.

It should be noted that in VDD>−|Vthp|≧Vin≧Vthn+VSS, the p-type differential multiplying circuit 100 and the n-type differential amplifying circuit 110 operate to establish the output nodes ND1 and ND2, and there is obtained a state of equilibrium in which the voltage of the input signal Vin and the voltage of the output signal Vout are substantially equal, even without operating the first and the second auxiliary circuits 130 and 140 to define the potentials of the output nodes ND1 and ND2.

Figure 13:
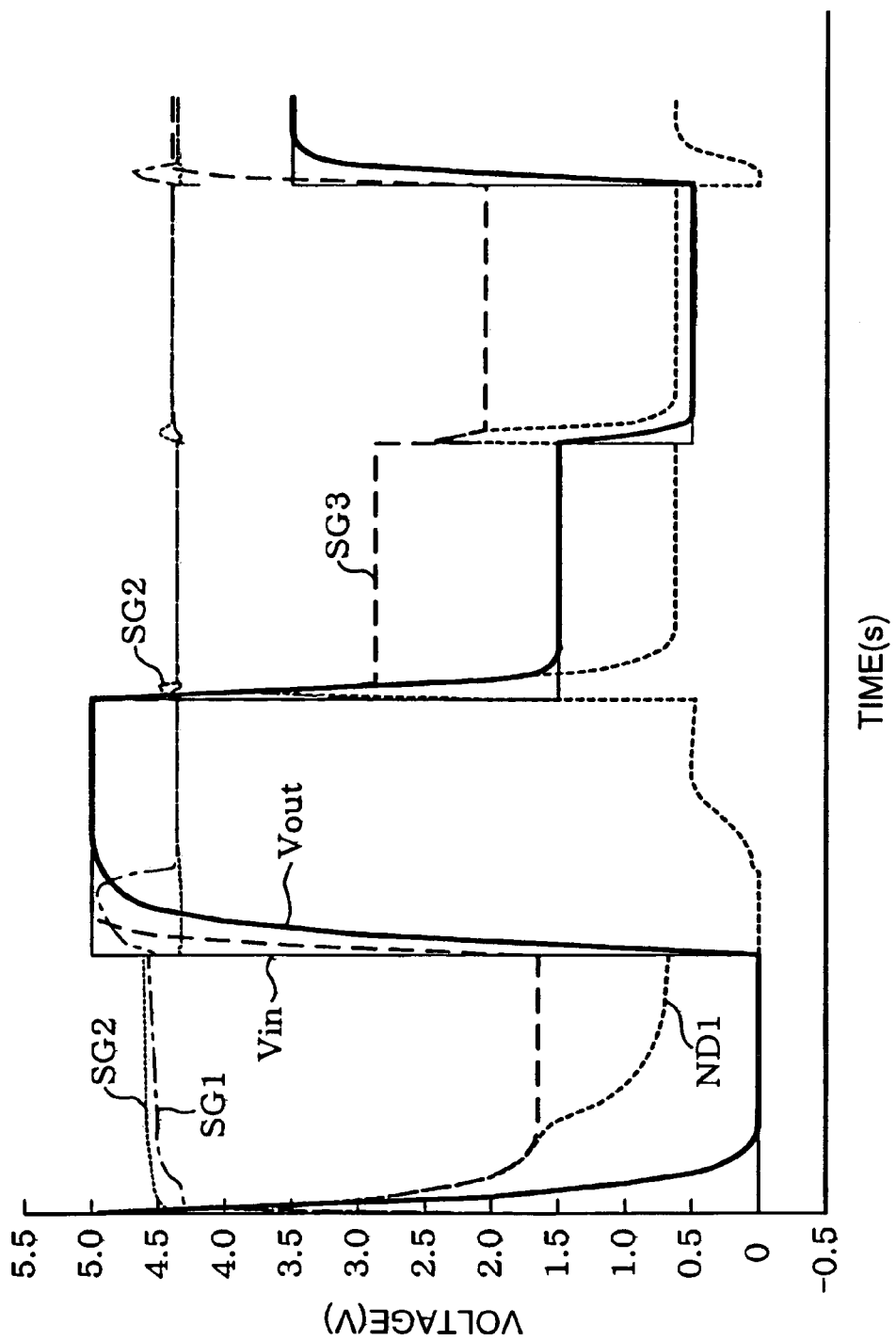
FIG. 13 is a diagram showing simulation results of voltage changes of a p-type differential amplifying circuit and a node of a first auxiliary circuit.
Figure 14:
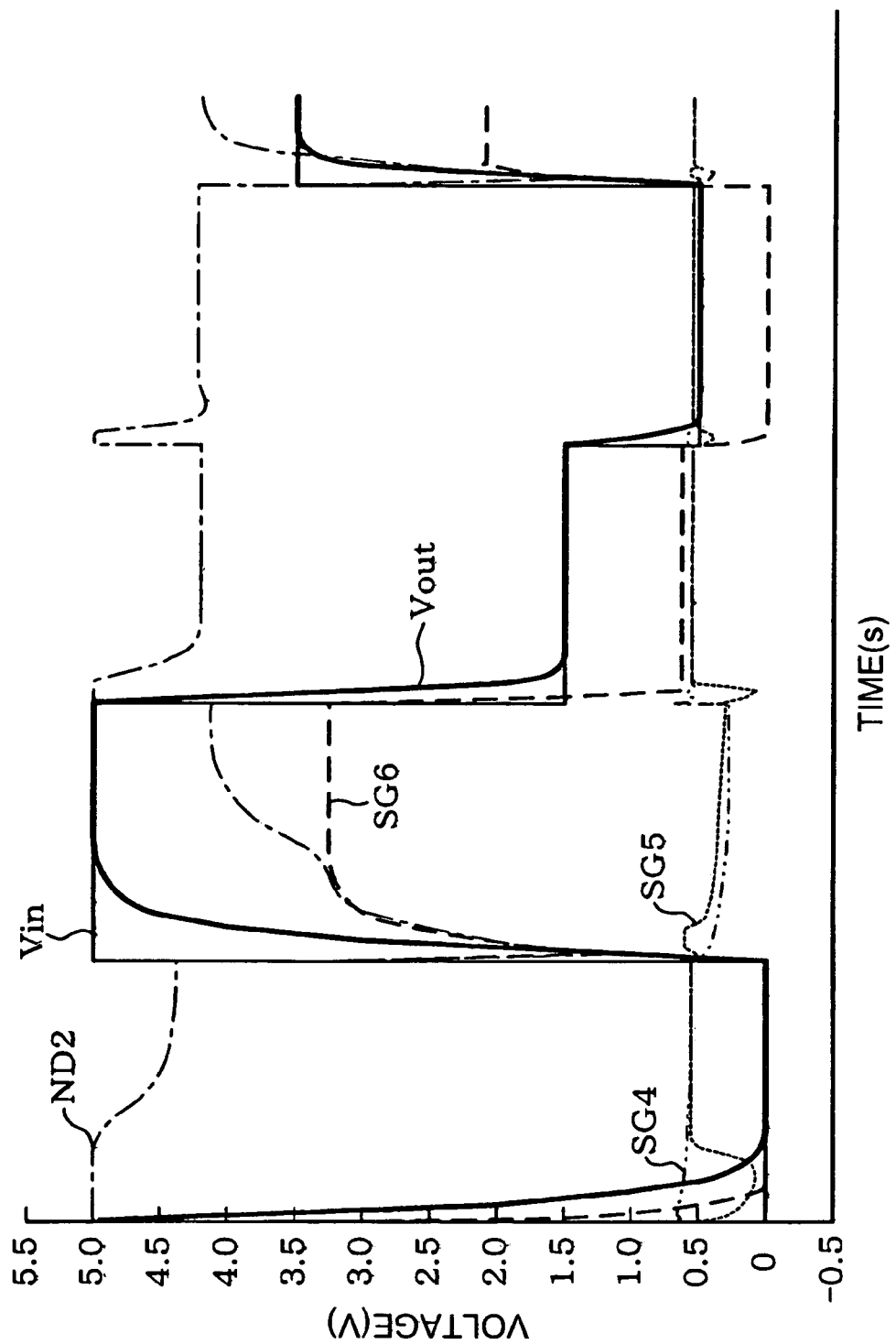
FIG. 14 is a diagram showing simulation results of voltage changes of an n-type differential amplifying circuit and a node of a second auxiliary circuit.

In FIG. 13, results of simulation of voltage changes of the p-type differential multiplying circuit 100 and the node of the first auxiliary circuit 130 are shown. In FIG. 14, results of simulation relating to voltage changes of the n-type differential multiplying circuit 110 and the node of the second auxiliary circuit 140 are shown, Further in FIG. 15, results of simulation of voltage changes of the output node ND1 and ND2 are shown.

In FIG. 13, a node SG1 is the gate of the first current drive transistor PA1. A node SG2 is a gate of the second current drive transistor PA2. A node SG3 is a source of the p-type transistors PT1 and PT2 constituting the first pair of differential transistors.

In FIG. 14, the node SG4 is the gate of the fourth current drive transistor NA4. The node SG5 is the gate of the third current drive transistor NA3. The node SG6 is the source of the n-type transistors NT3 and NT4 constituting the second pair of differential transistors.

Figure 15:
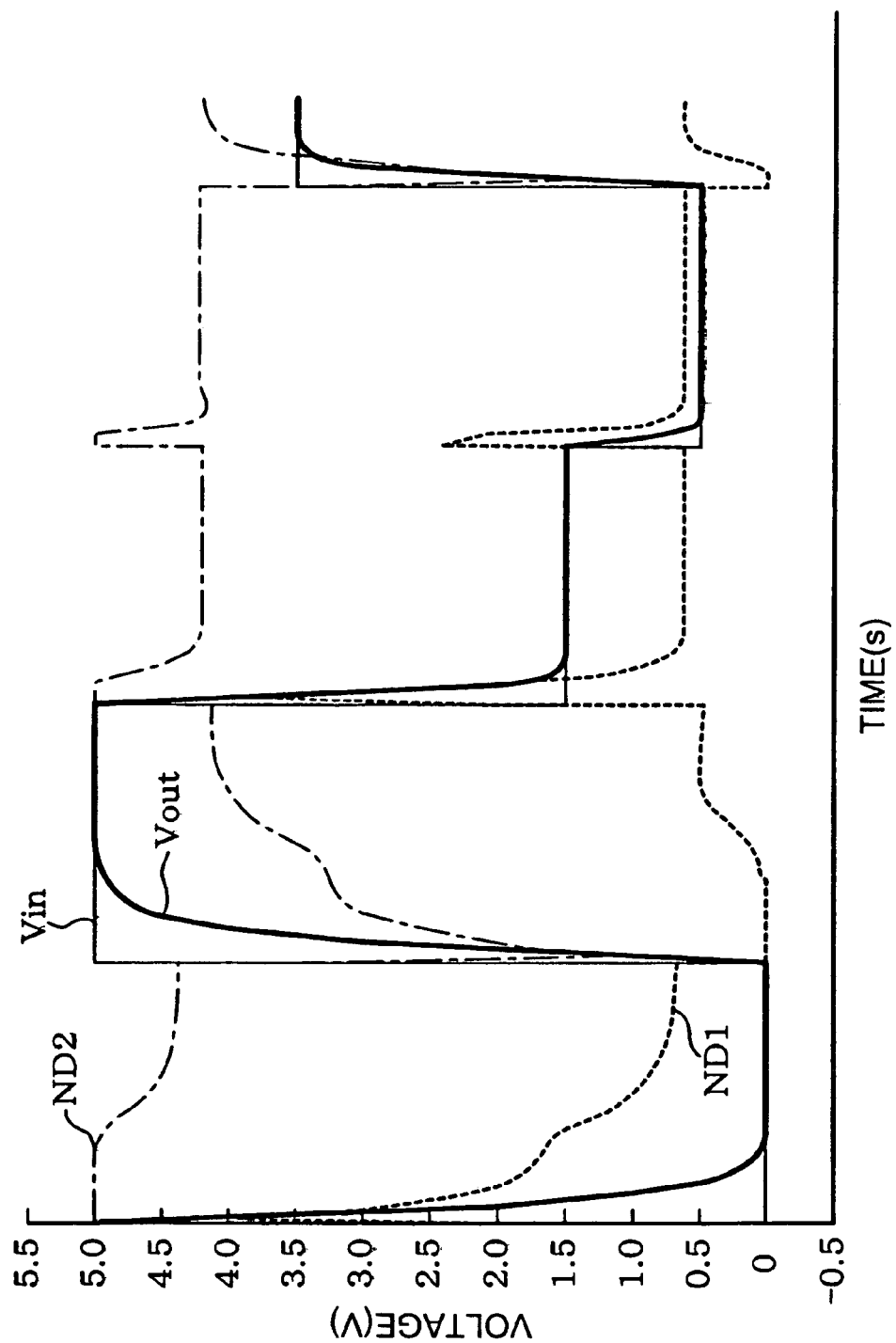
FIG. 15 is a diagram showing simulation results of voltage changes of an output node.

As shown in FIG. 13 to FIG. 15, even if the input signal Vin in the vicinity of 0.5 volts is inputted, the output node ND1 is not in the indefinite state, controlling the gate voltage of the first drive transistor NTO1 constituting the output circuit 120.

Figure 16:
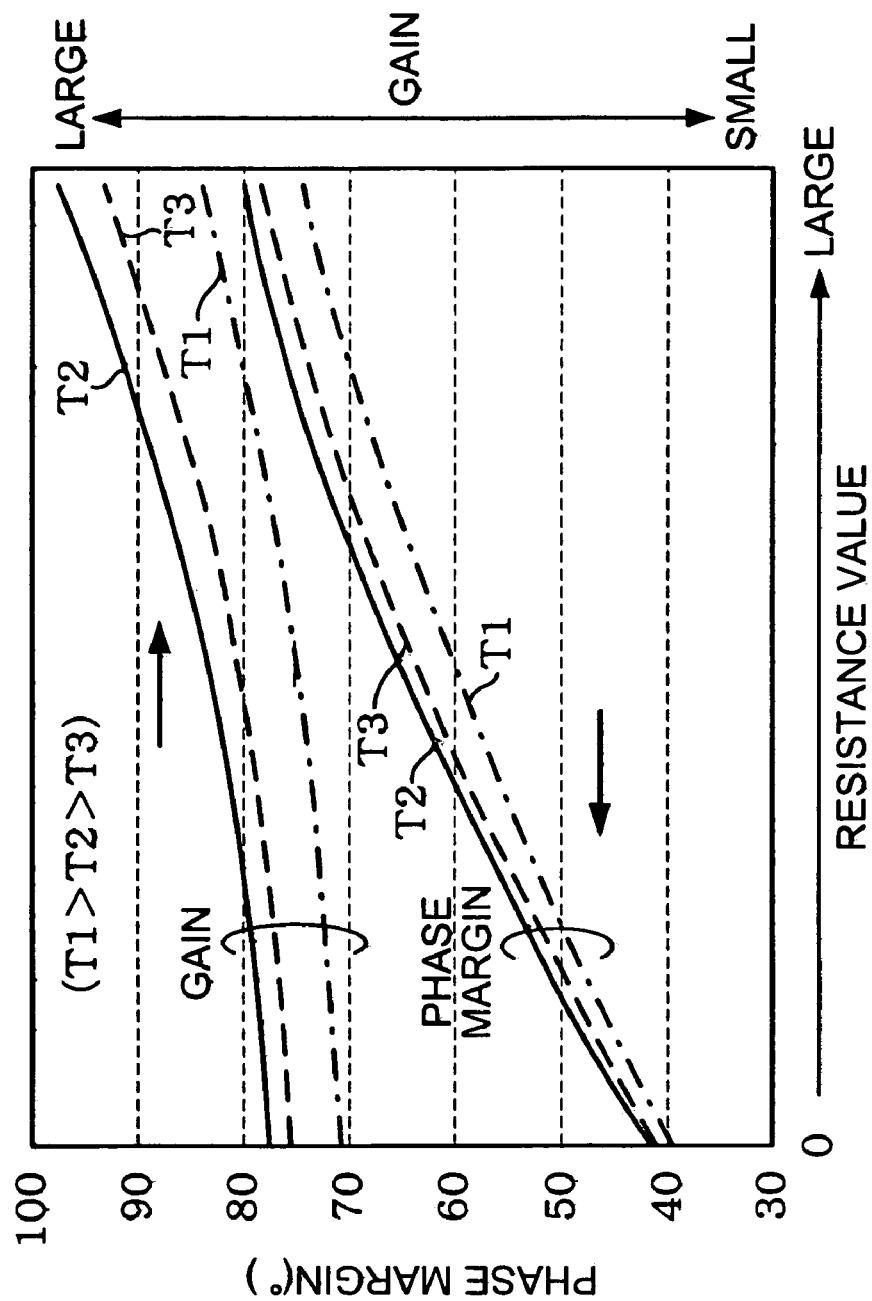
FIG. 16 is a diagram showing simulation results of phase margin changes and gain changes of an arithmetic amplifying circuit when load is not connected.

In FIG. 16, there are shown results of simulation of changes in phase margin and changes in gain when the load is not connected in regard to the arithmetic amplifying circuit 10 having the voltage follower circuit 20 of configuration shown in FIG. 9 to FIG. 11. How phase margin and gain change corresponding to the resistance value of the resistance circuit 30 per operating temperature of operating temperatures T1, R2, T3 (T1>T2>T3) is herein shown. In this manner, in the arithmetic amplifying circuit 10, it is possible to determine the phase margin when the load is not connected by changing the resistance value of the resistance circuit 30.

Figure 17:
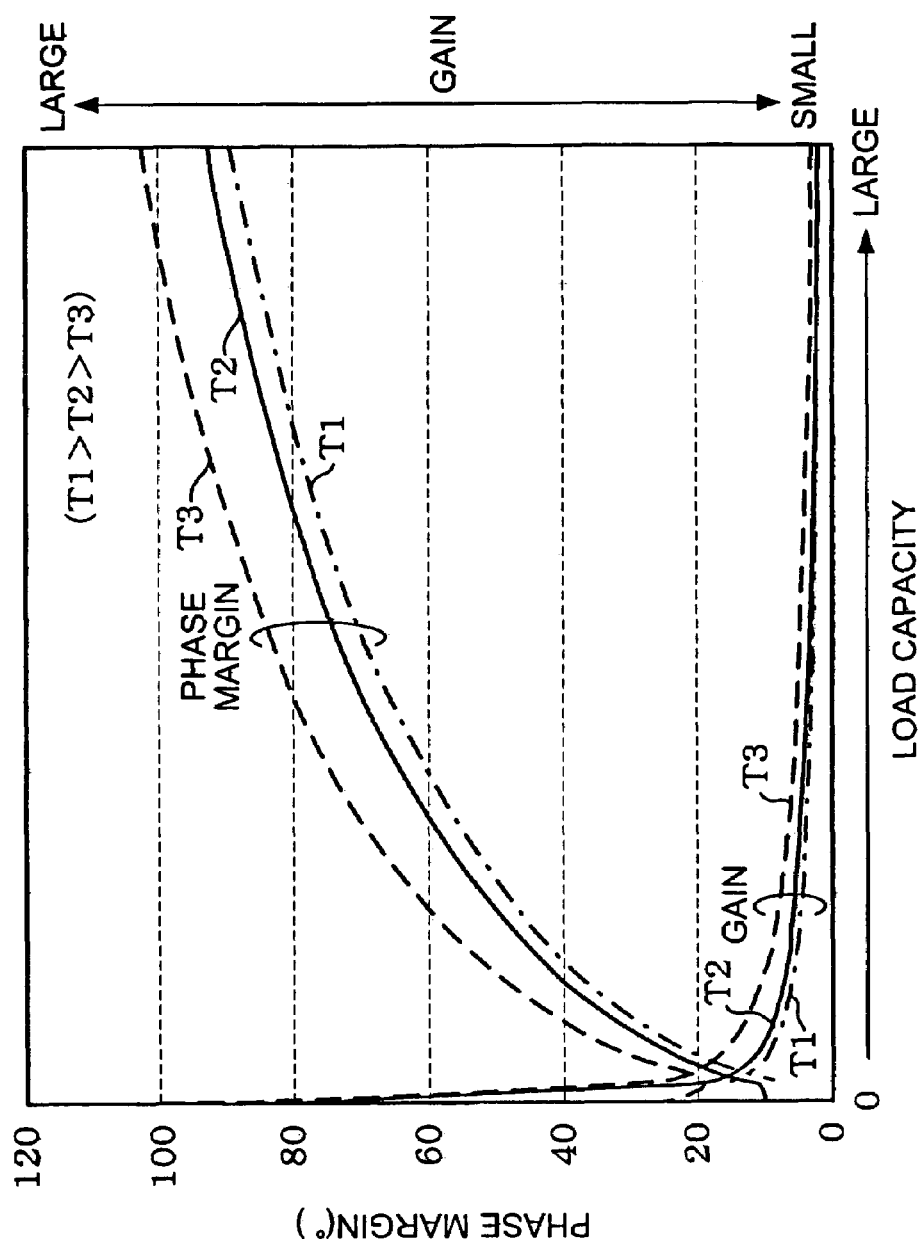
FIG. 17 is a diagram showing simulation results of phase margin changes and gain changes of an arithmetic amplifying circuit when load is connected.

In FIG. 17, there are shown results of simulation of changes in phase margin and changes in gain when the load is connected in regard to the arithmetic amplifying circuit 10 having the voltage follower circuit 20 of configuration shown in FIG. 9 to FIG. 11. With the resistance value of the resistance circuit 30 fixed, how phase margin and gain change corresponding to the load capacity of the load 40 per operating temperature of operating temperatures T1, R2, T3 (T1>T2>T3) is herein shown. In this manner, in the arithmetic amplifying circuit 10, the larger the load capacity of the load 40 grows, the larger the phase margin becomes.

As explained above, according to the arithmetic amplifying circuit 10 having a voltage follower circuit 20 of the present embodiment, it is possible to implement control so as to eliminate the input insensitive zone, to operate in a so-called rail-to-rail manner, and to suppress the through current of the output current 120 with certainty. By this means, an arithmetic amplifying circuit that can realize a large scale reduction of power consumption can be offered. Further, since AB class operation is feasible, in polarity inverted drive that inverts an impressed voltage on liquid crystal, it is possible to drive while stabilizing the data line regardless of polarity.

Since the output nodes ND1 and ND2 are driven through the first and the second auxiliary circuits 130 and 140, the reaction rate of the differential section 22 at high speed is realized, while the capacitor for phase compensation is made unnecessary. Further, by diminishing the current drive capacity of the first and the second drive transistors PTO1 and NTO1 of the output section 24, the reaction rate of the output section 24 at low speed can be realized. Consequently, there is obtained an effect of driving by the use of the same arithmetic amplifying circuit with respect to various display panels having different load capacities by means of panel size expansion.

Further, in the voltage follower circuit that feeds back the output signal Vout, it is necessary to prevent oscillation so as to stabilize the output, whereas connecting a phase compensation capacity between the arithmetic amplifying circuit and the output circuit to provide for phase margin is typically carried out. In this case, assuming current consumption as I and a capacity value of the capacitor for phase compensation as C, a throughput rate S is known to be proportional to I/C. Consequently, to increase the throughput rate of the voltage follower circuit, the capacity value C is either reduced or the current consumption I is increased.

On the other hand, in the present embodiment, as mentioned above, the capacitor for phase compensation is dispensed with, so that it is not restricted by the above-mentioned throughput rate formula. Consequently, the throughput rate can be increased without increasing the current consumption I.

2.3 Adjustment of Current Values

In the voltage follower circuit 20 according to the present embodiment, it is possible to further improve the stability of the circuit by devising current values at the time of operating the current sources of the p-type differential amplifying circuit 100, the n-type differential amplifying circuit 110, the first auxiliary circuit 130, and the second auxiliary circuit 140.

Figure 18:
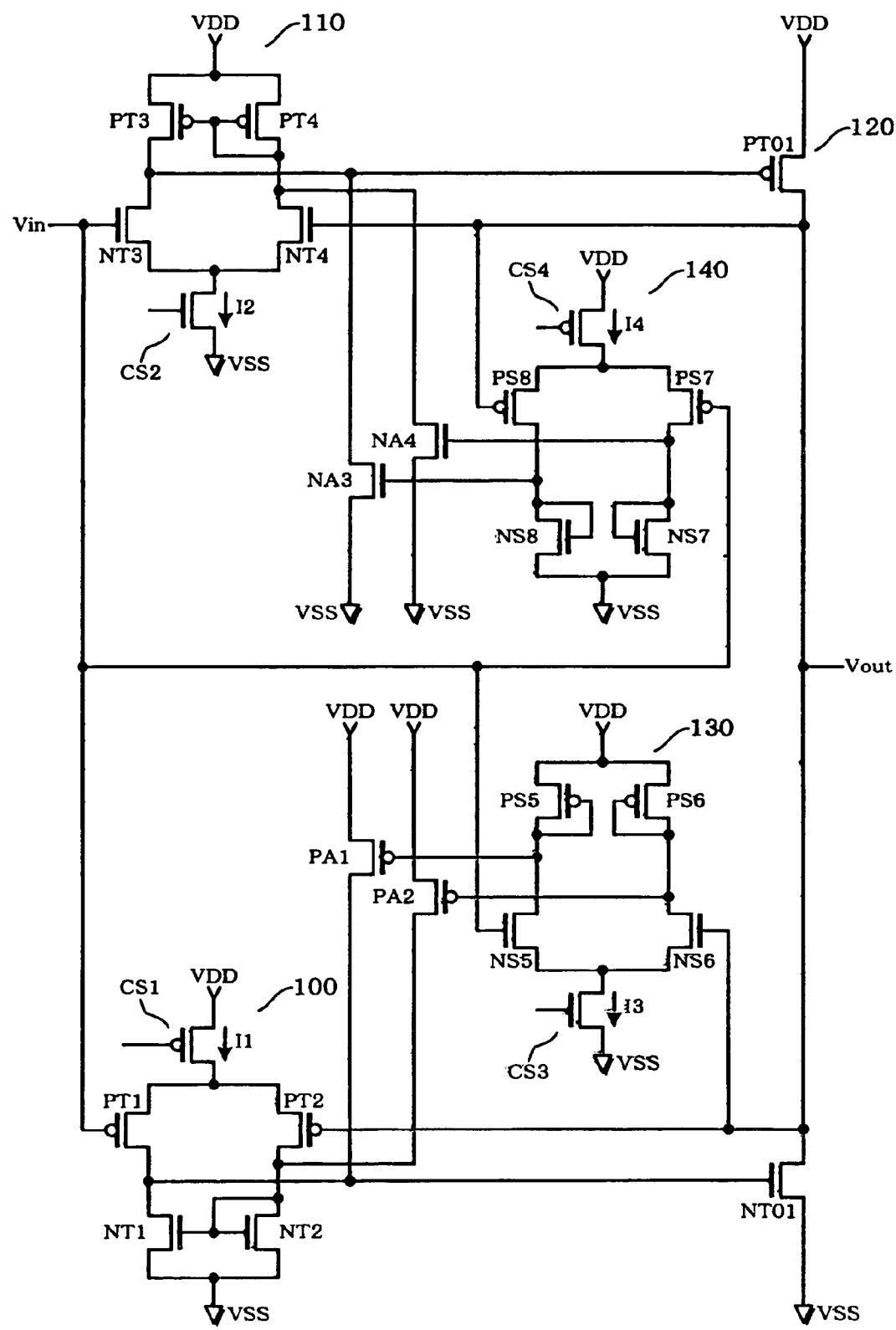
FIG. 18 is a circuit diagram of another configuration example of a voltage follower circuit in the present embodiment.

In FIG. 18, a circuit diagram of another configuration example of a voltage follower circuit 20 according to the present embodiment is shown. In FIG. 18, each current source is constituted by a transistor. In this case, wasteful current consumption of the current source can be reduced by controlling the gate voltage of each transistor.

To improve the stability of the voltage follower circuit 20, making the drain currents of the first and the second drive transistors NTO1 and PTO1 constituting the output circuit 120 equal is effective. The drain current of the first drive transistor NTO1 is determined by a current value of I1 at the time of operating the current source CS1 of the p-type differential amplifying circuit 100 and a current value of I3 at the time of operating the current source C3 of the first auxiliary circuit 130. The drain current of the second drive transistor PT01 is determined by a current value of I2 at the time of operating the second current source CS2 of the n-type differential amplifying circuit 110 and a current value of I4 at the time of operating the fourth current source C4 of the second auxiliary circuit 140.

It is assumed at this point that the current value of I1 and the current value of I3 are not equal. For example, suppose the current value of I1 is 10 and the current value of I4 is 5. Likewise, it is assumed that the current value of I2 and the current value of I4 are not equal. For example, the current value of 10 is 0 and the current value of I4 is 5.

If the voltage of the input signal Vin is in a range in which the p-type differential amplifying circuit 100 and the first auxiliary circuit 130 operate, the drain current of the first drive transistor NTO1 flows, for example, in an amount comparable to 15 (=I1+I3=10+5). Likewise, if the voltage of the input signal Vin is in a range in which the n-type differential amplifying circuit 110 and the second auxiliary circuit 140 operate, the drain current of the second drive transistor PTO1 flows, for example, in an amount comparable to 15 (=I2+I4=10+5).

On the other hand, suppose the voltage of the input signal Vin decreases to such an extent that the n-type transistor does not operate, then the first auxiliary circuit 130 of the n-type differential amplifying circuit 110 does not operate. Consequently, the second and the third current sources CS2 and CS3 do not flow (I2=0 and I3=0). As a result, the drain current of the first drive transistor NTO1 flows, for example, in an amount comparable to 10(=I1), while the drain current of the second drive transistor PTO1 flows, for example, in an amount comparable to 5(=I4). For example, the same applies if the voltage of the input signal Vin rises to such an extent that the p-type transistor does not operate.

In this manner, if the drain currents of the first and the second drive transistors NTO1 and PTO1 constituting the output circuit 120 are different with different leading or trailing end of the output signal Vout, the time for the output to stabilize becomes different, thus facilitating oscillation.

It is preferable that in a voltage follower circuit according to the present invention, the current values of the first and the third current sources CS1 and CS3 at the time of operation are equal (I1=I3) and that the current values of the second and the fourth current sources CS2 and CS4 at the time of operation are equal (I2=I4). This is realized by making channel lengths L of the transistors constituting the first to the fourth current sources CS1 to CS4 common, channel widths of the transistors constituting the first to the third current sources CS1 and CS3 equal, and channel widths of the transistors constituting the second and the fourth current sources CS2 and CS4 equal.

Further, it is preferable that the current value of each current source of CS1 to CS4 at the time of operation is equal (I1=I2=I3=I4). In this case, designing is facilitated.

Further, by reducing at least one of the current values of the third and the fourth current sources CS3 and CS4 at the time of operation, lower power consumption may be achieved. In this case, it is necessary to reduce at least one of the current values of the third and the fourth current sources CS3 and CS4 at the time of operation without lowering the current drive capacity of each transistor of the first to the fourth current drive transistors PA1, PA2, NA3, and NA4.

Figure 19:
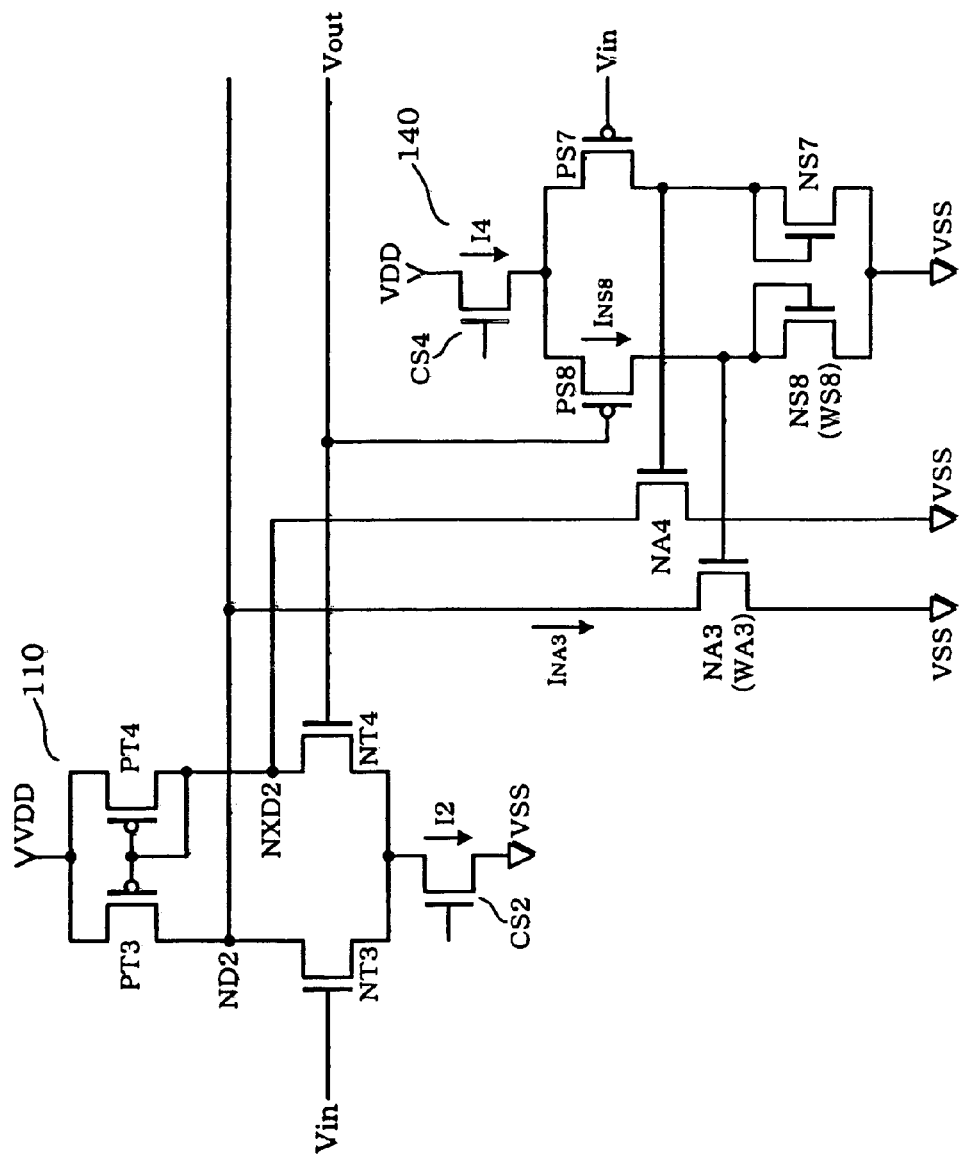
FIG. 19 is an explanatory diagram of a configuration example reducing a current value of a fourth current source at the time of operation.

In FIG. 19, an explanatory diagram of a configuration example of reducing the current value of the fourth current source CS4 at the time of operation is shown. However, the like parts of FIG. 9, FIG. 12, and FIG. 18 are provided with like reference numerals, and explanation is omitted as appropriate.

In FIG. 19, to reduce the current value of the fourth current source CS4 at the time of operation, use is made of the fact that the third and the eighth current drive transistors NA3 and NS8 constitute a current mirror circuit. Assume that a channel length of the third current drive transistor NA3 is L, a channel width is WA3, a drain current of the third transistor NA3 is $I_{NA3}$, and a drain current of the eighth current drive transistor NS8 is $I_{NS8}$. At this time, $I_{NA3}$ may be expressed as $I_{NA3}=(WA3/WS8) \times I_{NS8}$. Herein, (WA3/WS8) means a ratio of the current drive capacity of the third current transistor NA3 relative to the current drive capacity of the eighth current transistor NA8. Accordingly, by making (WA3/WS8) larger than 1, the drain current $I_{NA3}$ can be decreased without lowering the current drive capacity of the third current drive transistor NAS3, whereas the current value I4 of the fourth current source CS4 at the time of operation can also be decreased.

It should be noted that in FIG. 19, the fourth and the seventh current drive transistors NA4 and NS7 constituting a current mirror circuit may be utilized.

Further, likewise, it is preferable that the current values of the third current source CS3 at the time of operation be reduced. In this case, use may be made of the fact that the first and the sixth current drive transistors PA3 and PS6 constitute a current mirror circuit, and that the second and the fifth current drive transistors PA2 and PS5 constitute a current mirror circuit may be utilized.

As the foregoing shows, at least one of a ratio of current drive capacity of the first current drive transistor PA1 to the current drive capacity of the sixth current drive transistor PS6, the ratio of current drive capacity of the second current drive transistor PA2 to the current drive capacity of the fifth current drive transistor PS5, the ratio of current drive capacity of the third current drive transistor NA3 to the current drive capacity of the eighth current drive transistor NS8, and the ratio of current drive capacity of the fourth current drive transistor NA4 to the current drive capacity of the seventh current drive transistor NS7 is made larger than 1. By doing this, at least one of the current values of the third and the fourth current sources CS3 and CS4 may be reduced.

It should be noted that the present invention is not limited to the embodiments described above and that various modifications and changes may be made within the spirit and scope thereof For example, description has been made of a case where application is made to a liquid crystal display panel as a display panel, but the present invention is not restricted thereby. Also, while each transistor has been explained as a MOS transistor, the present invention is not limited to such a case.

Further, configurations of the voltage follower circuit, the p-type differential amplifying circuit as well as the n-type differential amplifying circuit, the output circuit, the first auxiliary circuit, and the second auxiliary circuit which constitute the voltage follower circuit, are not limited to the configuration described above, and various equivalent configurations of these may be employed.

What is claimed is:

1. An arithmetic amplifying circuit to drive a capacitive load having a voltage follower circuit converting an input signal to impedance, and a resistance circuit being serially connected between the voltage follower circuit and an output of the arithmetic amplifying circuit, the voltage follower circuit comprising:
   a differential section amplifying a differential between the input signal and an output signal of the voltage follower circuit; and
   an output section outputting the output signal of the voltage follower circuit based on an output of the differential section, wherein the capacitive load is driven through the resistance circuit,
   wherein a throughput rate of the output of the differential section is at least equal to a throughput rate of the output of the output section.

2. The arithmetic amplifying circuit according to claim 1, wherein the resistance circuit-includes a variable resistance element.

3. The arithmetic amplifying circuit according to claim 1, wherein the resistance circuit includes a plurality of analog switching elements in which each analog switching element is connected in parallel.

4. An arithmetic amplifying circuit to drive a capacitive load having a voltage follower circuit converting an input signal to impedance, and a resistance circuit being serially connected between the voltage follower circuit and an output of the arithmetic amplifying circuit, the voltage follower circuit comprising:
   a differential section amplifying a differential between the input signal and an output signal of the voltage follower circuit;
   an output section outputting the output signal of the voltage follower circuit based on an output of the differential section, wherein the capacitive load is driven through the resistance circuit; and
   a resistance value setting register for setting a resistance value of the resistance circuit, the value of the resistance circuit being subject to change according to a setting content of the resistance value setting register,
   wherein the resistance circuit includes a variable resistance element.

5. The arithmetic amplifying circuit according to claim 1, further comprising:
   the differential section including a first conductive type differential amplifying circuit having the first pair of differential transistors of a first conductive type, a gate of each transistor of which an input signal and an output signal are inputted into, concurrently when a source of each transistor is connected to a first current source, and also having a first current mirror circuit generating a drain current of each transistor of the first pair of differential transistors;
   a second conductive type differential amplifying circuit having a second pair of differential transistors of a second conductive type, into a gate of each transistor of which the input signal and the output signal are inputted, concurrently when a source of each transistor is connected to a second current source, and also having a second current mirror circuit generating a drain current of each transistor of the second pair of differential transistors;
   a first auxiliary circuit driving at least one of a first output node and a first inverted output node which are drains of two transistors constituting the first pair of differential transistors based on the input signal and the output signal, and a second auxiliary circuit driving at least one of a second output node and a second inverted output node which are drains of two transistors constituting the second pair of differential transistors based on the input signal and the output signal; and
   the output section including a first drive transistor of the second conductive type in which a gate voltage thereof is controlled based on a voltage of the first output node, and a second drive transistor of the first conductive type in which a drain thereof is connected to the drain of the first drive transistor and a gate voltage thereof is controlled based on a voltage of the second output node,
   wherein the drain voltage of the first drive transistor is outputted as the output signal; and
   when, of the transistors constituting the first pair of differential transistors, an absolute value of a voltage between the gate and source of the transistor whose gate is inputted with the input signal is less than an absolute value of a threshold voltage of the transistor, as the first auxiliary circuit drives at least one of the first output node and the first inverted output node, the gate voltage of the first drive transistor is controlled; and
   when, of the transistors constituting the second pair of differential transistors, the absolute value of a voltage between the gate and source of the transistor whose gate is inputted with the input signal is less than the absolute value of the threshold voltage of the transistor, as the second auxiliary circuit drives at least one of the second output node and the second inverted output node, the gate voltage of the second drive transistor is controlled.

6. The arithmetic amplifying circuit according to claim 1, wherein the differential section includes:
   a first conductive type differential amplifying circuit amplifying a differential between the input signal and the output signal;
   a second conductive type differential amplifying circuit amplifying the differential between the input signal and the output signal;
   a first auxiliary circuit driving at least one of the first output node and the first inverted output node based on the input signal and the output signal; and
   a second auxiliary circuit driving at least one of the second output node and the second inverted output node based on the input signal and the output signal,
   wherein the output section generates the output signal based on the voltage of the first and the second output nodes;
   the first conductive type differential amplifying circuit includes:
      a first current source with a first power voltage being supplied to one end;
      a first pair of differential transistors of the first conductive type, in which a source of each transistor is connected to the other end of the first current source, a drain of each transistor being connected to respective first output node and the first inverted output node, the input signal and the output signal being inputted to the gate of each transistor, and
      a first current mirror circuit having the first pair of transistors of the second conductive type in which gates are mutually connected,
   wherein a second power voltage is supplied to the source of each transistor constituting the first pair of transistors;
   the drain of each transistor is connected to respective first output node and the first inverted output node;
   of the transistors constituting the first pair of transistors, a drain and a gate of the transistor connected to the first inverted output node are connected;
   the second conductive type differential amplifying circuit includes:
      a second current source with the second power voltage being supplied to one end;
      a second pair of differential transistors of the second conductive type, in which a source of each transistor is connected to the other end of the second current source;
      a drain of each transistor being connected to respective second output node and the second inverted output node,
   wherein the input signal and the output signal is inputted to the gate of each transistor, and a second current mirror circuit has a second pair of transistors of the first conductive type in which gates are mutually connected,
   wherein a first power voltage is supplied to the source of each transistor constituting the second pair of transistors;
   the drain of each transistor is connected to respective second output node and the second inverted output node;
   wherein, of the transistors constituting the second pair of transistors, a drain and a gate of the transistor connected to the second inverted output node are connected;

the output section including a second drive transistor of a first conductive type whose gate is connected to the second output node; and
   a first drive transistor of a second conductive type in which the gate thereof is connected to the first output node, the drain thereof being connected to a drain of the second drive transistor, wherein a voltage of the drain is outputted as the output signal;
   when, of the transistors constituting the first pair of differential transistors, the absolute value of a voltage between the gate and source of the transistor whose gate is inputted with the input signal is less than the absolute value of the threshold voltage of the transistor, the first auxiliary circuit controls the gate voltage of the first drive transistor by driving at least one of the first output node and the first inverted output node; and
   when, of the transistors constituting the second pair of differential transistors, the absolute value of a voltage between the gate and source of the transistor whose gate is inputted with the input signal is less than the absolute value of the threshold voltage of the transistor, the second auxiliary circuit controls the gate voltage of the first drive transistor by driving at least one of the second output node and the second inverted output node.

7. The arithmetic amplifying circuit according to claim 5, wherein, the first auxiliary circuit includes:
   the first and the second current drive transistors of the first conductive type, in which the first power voltage is supplied to the source of each transistor, while the drain of each transistor being respectively connected to the first output node and first inverted output node; and
   a first current control circuit controlling gate voltages of the first and the second current drive transistors based on the input signal and the output signal,
   wherein when, of the transistors constituting the first pair of differential transistors, the absolute value of the voltage between the gate and source of the transistor whose gate is inputted with the input signal is less than the absolute value of the threshold voltage of the transistor,
   wherein the first current control circuit controls the gate voltages of the first and the second current drive transistors by driving at least one of the first output node and the first inverted output node.

8. The arithmetic amplifying circuit according to claim 5, wherein the second auxiliary circuit includes:
   the third and the fourth current drive transistors of the second conductive type, in which the second power voltage is supplied to the source of each transistor, while the drain of each transistor being respectively connected to the second output node and second inverted output node; and
   a second current control circuit controlling gate voltages of the third and the fourth current drive transistors based on the input signal and the output signal,
   wherein when, of the transistors constituting the second pair of differential transistors, the absolute value of a voltage between the gate and source of the transistor whose gate is inputted with the input signal is less than the absolute value of the threshold voltage of the transistor,
   wherein the second current control circuit controls the gate voltages of the third and the fourth current drive transistors by driving at least one of the second output node and the second inverted output node.

9. The arithmetic amplifying circuit according to claim 7, wherein, the first current control circuit includes:
- a third current source with the first power voltage being supplied to one end; the third pair of differential transistors of the second conductive type, in which a source of each transistor is connected to the other end of the third current source, the input signal and the output signal being inputted to the gate of each transistor; and
- a fifth and a sixth current drive transistors of the first conductive type, in which the first power voltage is supplied to the source of each transistor, while the drain of each transistor being respectively connected to the drain of each transistor, and to which the gate and the drain of each transistor is connected,
- wherein of the transistors constituting the third pair of differential transistors, a drain of the transistor whose gate is inputted with the input signal is connected to a gate of the second current drive transistor; and
- of the transistors constituting the third pair of differential transistors, the drain of the transistor whose gate is inputted with the output signal is connected to a gate of the first current drive transistor.

10. The arithmetic amplifying circuit according to claim 7, wherein:
the second current control circuit includes:
- a fourth current source with the first power voltage being supplied to one end;
- a fourth pair of differential transistors of the first conductive type, in which a source of each transistor is connected to the other end of the fourth current source, the input signal, while the output signal being inputted to the gate of each transistor; and
- a seventh and an eighth current drive transistors of the second conductive type, in which the second power voltage is supplied to the source of each transistor, while the drain of each transistor being respectively connected to the drain of each transistor of the fourth pair of differential transistors, and to which the gate and the drain of each transistor is connected,
- wherein of the transistors constituting the fourth pair of differential transistors, a drain of the transistor whose gate is inputted with the input signal is connected to a gate of the fourth current drive transistor; and
- of the transistors constituting the fourth pair of differential transistors, the drain of the transistor whose gate is inputted with the output signal is connected to a gate of the third current drive transistor.

11. The arithmetic amplifying circuit according to claim 9, wherein:
the second current control circuit includes:
- a fourth current source with the first power voltage being supplied to one end;
- the fourth pair of differential transistors of the first conductive type, in which a source of each transistor is connected to the other end of the fourth current source, the input signal and the output signal being inputted to the gate of each transistor; and
- a seventh and an eighth current drive transistors of the second conductive type in which the second power voltage is supplied to the source of each transistor, while the drain of each transistor being respectively connected to the drain of each transistor, and to which the gate and the drain of each transistor is connected,
- wherein of the transistors constituting the fourth pair of differential transistors, a drain of the transistor whose gate is inputted with the input signal is connected to a gate of the fourth current drive transistor,
- wherein of the transistors constituting the fourth pair of differential transistors, the drain of the transistor whose gate is inputted with the output signal is connected to a gate of the third current drive transistor.

12. The arithmetic amplifying circuit according to claim 11, wherein the first and the third current sources whose current values at the time of operation are equal and the second and the fourth current sources whose current values at the time of operation are equal.

13. The arithmetic amplifying circuit according to claim 12, wherein the first to the fourth current sources whose current values at the time of operation are equal.

14. The arithmetic amplifying circuit according to claim 11, wherein at least one of a ratio of current drive capacity of the first current drive transistor to the current drive capacity of the sixth current drive transistor, the ratio of current drive capacity of the second current drive transistor to the current drive capacity of the fifth current drive transistor, the ratio of current drive capacity of the third current drive transistor to the current drive capacity of the eighth current drive transistor, and the ratio of current drive capacity of the fourth current drive transistor to the current drive capacity of the seventh current drive transistor is larger than 1.

15. A drive circuit for driving an electro-optical apparatus having a plurality of scanning lines, a plurality of data lines, amd a pixel electrode specified by a scanning line, and a data line, comprising:
- an arithmetic amplifying circuit according to claim 1 per data line; and
- a data voltage generating circuit being set up per data line and generating a data voltage as an input signal to the arithmetic amplifying circuit.

16. A method of adjusting a phase margin of an arithmetic amplifying circuit according to claim 2, comprising:
- increasing a capacity of a capacitive load as a resistance value of a resistance circuit is set smaller; and
- decreasing the capacity of the capacitive load as the resistance value of the resistance circuit is set larger.

* * * * *